United States Patent
Choi et al.

(10) Patent No.: US 12,111,688 B2
(45) Date of Patent: Oct. 8, 2024

(54) ELECTRONIC DEVICE INCLUDING HOUSING AND MANUFACTURING METHOD THEREOF

(71) Applicant: Samsung Electronics Co., Ltd., Gyeonggi-do (KR)

(72) Inventors: Byounghee Choi, Gyeonggi-do (KR); Sunghoon Kim, Gyeonggi-do (KR); Sungjin Park, Gyeonggi-do (KR); Jinho Lee, Gyeonggi-do (KR); Youngsoo Jang, Gyeonggi-do (KR); Sanggyou Choi, Gyeonggi-do (KR); Yongwook Hwang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 239 days.

(21) Appl. No.: 17/697,170

(22) Filed: Mar. 17, 2022

(65) Prior Publication Data
US 2022/0300034 A1 Sep. 22, 2022

Related U.S. Application Data

(63) Continuation of application No. PCT/KR2022/003753, filed on Mar. 17, 2022.

(30) Foreign Application Priority Data
Mar. 17, 2021 (KR) .......................... 10-2021-0034691

(51) Int. Cl.
*G06F 1/16* (2006.01)

(52) U.S. Cl.
CPC .......... *G06F 1/1626* (2013.01); *G06F 1/1656* (2013.01)

(58) Field of Classification Search
CPC ..... G06F 1/1626; G06F 1/1656; G06F 1/1698
See application file for complete search history.

(56) References Cited

U.S. PATENT DOCUMENTS

2012/0175165 A1* 7/2012 Merz ..................... G06F 1/1656
  174/50
2012/0329531 A1 12/2012 Park et al.
(Continued)

FOREIGN PATENT DOCUMENTS

CN    110468440 A    11/2019
JP    2017-50542 A    3/2017
(Continued)

OTHER PUBLICATIONS

International Search Report Dated Jun. 21, 2022.
European Search Report dated Mar. 12, 2024.

*Primary Examiner* — Adrian S Wilson
(74) *Attorney, Agent, or Firm* — Cha & Reiter, LLC

(57) ABSTRACT

Various embodiments of the disclosure provide an electronic device including a housing having a double texture, and a method for manufacturing the same. According to various embodiments disclosed herein, there may be provided an electronic including a housing that includes a first surface having a first surface roughness, a second surface having a second surface roughness different from the first surface, and a first connection portion between the first surface and the second surface. The electronic device may further include an oxide film layer disposed on the first surface, the second surface, and the first connection portion and configured to have a substantially uniform thickness. Various other embodiments may be applied.

18 Claims, 18 Drawing Sheets

(56) References Cited

U.S. PATENT DOCUMENTS

| | | |
|---|---|---|
| 2013/0008796 A1 | 1/2013 | Silverman et al. |
| 2013/0153428 A1 | 6/2013 | Akana et al. |
| 2014/0098502 A1 | 4/2014 | Lasarov et al. |
| 2015/0103123 A1 | 4/2015 | Chen et al. |
| 2017/0347476 A1 | 11/2017 | Hwang et al. |
| 2018/0073158 A1 | 3/2018 | Li et al. |
| 2018/0124221 A1 | 5/2018 | Li et al. |
| 2021/0022261 A1 | 1/2021 | Kiple et al. |

FOREIGN PATENT DOCUMENTS

| | | |
|---|---|---|
| KR | 20-0333367 Y1 | 11/2003 |
| KR | 10-2012-0140373 A | 12/2012 |
| KR | 10-2013-0132632 A | 12/2013 |
| KR | 10-2014-0098172 A | 8/2014 |
| KR | 10-1720116 B1 | 4/2017 |
| KR | 10-2017-0134001 A | 12/2017 |
| KR | 10-2018-0019700 A | 2/2018 |
| WO | 2013/192579 A1 | 12/2013 |
| WO | 2019/245580 A1 | 12/2019 |

\* cited by examiner

ELECTRONIC DEVICE INCLUDING HOUSING AND MANUFACTURING METHOD THEREOF

CROSS-REFERENCE TO RELATED APPLICATION(S)

This application is a continuation application, claiming priority under § 365(c), of an International application No. PCT/KR2022/003753 designating the United States, filed on Mar. 17, 2022, in the Korean Intellectual Property Receiving Office and claiming priority to Korean Patent Application No. 10-2021-0034691, filed on Mar. 17, 2021, in the Korean Intellectual Property Office, the disclosures of which are incorporate by reference herein in their entireties.

TECHNICAL FIELD

Various embodiments of the disclosure relate to an electronic device including a housing and a method for manufacturing the same.

BACKGROUND

As information/communication technologies and semiconductor technologies have developed, various types of electronic devices have been widespread and used at a rapid pace. Particularly, recent electronic devices have been developed such that the they are portable and can be used for communication. In addition, electronic devices may output stored information as sounds or images. In line with high degrees of integration of electronic devices and widespread use of super-fast large-capacity wireless communication networks, it has recently become possible to equip a single electronic device (for example, mobile communication terminal) with various functions. For example, not only communication functions, but also entertainment functions (for example, gaming), multimedia functions (for example, music/video playback), communication and security functions for mobile banking, scheduling functions, and electronic wallet functions can be implemented in a single electronic device. Such electronic devices have become compact and easily portable.

There has been persistent research, in connection with manufacturing housings that constitute the exterior of these electronic devices, regarding use of metal materials such that various internal components of the devices and the like are protected from the external environment, and the electronic devices have aesthetically pleasing appearances, thereby drawing users' attention. In order to improve the aesthetic appeal of electronic devices in this manner, there have been increasing demands for design of housings implemented in various shapes, various colors, or various textures.

According to a housing processing process, it may be difficult to implement two or more textures on a single electronic device, such that a large number of processes and complicated operations may be necessary to implement two or more textures. For example, in connection with manufacturing a housing made of a metal material on which two or more textures (for example, the double texture of a matte surface and a glossy surface), a primary processing process may be performed to implement a texture, and a second processing process may then be performed to implement another texture. Prior to the secondary processing process, a preliminary anodizing process may be performed to form an oxide film layer on the housing surface formed by the primary processing process. By forming an oxide film layer using the anodizing process, the surface formed through the primary processing process may be prevented from being damaged by byproducts (for example, processing chips) generated during the secondary processing process, or from being corroded by cutting oil used during the processing process. In addition, after the secondary processing, an additional anodizing process may be performed to form an oxide film layer for protecting the housing surface formed through the secondary processing process. However, the oxide film layers formed through two anodizing processes as described above include an oxide film layer resulting from the primary processing process and another oxide film layer resulting from the secondary processing process, and these oxide film layers may not be formed uniformly as a whole on the housing surface. Oxide film layers formed on the surface formed by the primary processing process and on the surface formed by the secondary processing process may have different thicknesses. For example, the second anodizing process may expose the oxide film layer generated during the previous anodizing process to acidic environments, thereby causing surface damage, and needs to be performed for a short period of time. This may make it very difficult to grow the oxide film layer to have at least a predetermined thickness through the second anodizing process. As described above, in a certain embodiment, in connection with implementing a housing having a double texture (housing having different degrees of surface roughness), oxide film layers having different thicknesses may be formed on the housing surface. In this case, foreign substances may get stuck in a gap between the oxide film layers having different thicknesses, corrosion may occur due to moisture infiltrating into the gap, or the oxide film layers may be peeled off by external impacts to the housing.

As another example, when a metal material and a polymer material are implemented together, and in connection with manufacturing a housing having a double metal-material texture (for example, a matte surface and a glossy surface), if a polishing process is performed to create the glossy surface, a difference in roughness may occur between the surface of the polymer material adjacent to the glossy surface and the surface of the polymer material adjacent to the matte surface. Such a difference in texture may degrade the gloss uniformity of the housing and may degrade the aesthetic appearance of the electronic device.

SUMMARY

Various embodiments disclosed herein may provide an electronic device including: a housing including a first surface having a first surface roughness; a second surface having a second surface roughness different from the first surface; and a first connection portion between the first surface and the second surface; and an oxide film layer disposed on the first surface, the second surface, and the first connection portion and configured to have a substantially uniform thickness.

Various embodiments disclosed herein may provide an electronic device including: a housing including a first portion that includes an electrically conductive material and a second portion disposed adjacent to the first portion and including an insulating material; and an oxide film layer formed on the first portion, wherein the first portion includes a first surface having a first surface roughness and a second surface having a second surface roughness substantially different from the first surface, and wherein the second portion includes a fourth surface and a fifth surface having a substantially identical surface roughness to the fourth surface.

Various embodiments disclosed herein may provide a method for manufacturing a housing of an electronic device, the method including: a primary processing process for creating a first surface of the housing having a first surface roughness; a primary anodizing process for forming an intermediate oxide film layer on the first surface; a secondary processing process for creating a second surface of the housing having a second surface roughness; an anodizing film-stripping process for removing the intermediate oxide film layer formed on the first surface; and a secondary anodizing process for forming a oxide film layer on the first surface and the second surface.

Various embodiments disclosed herein may provide an electronic device having a housing including a metal material (for example, aluminum, magnesium, titanium) so as to constitute the exterior thereof, thereby providing the user with a device having aesthetic appeal.

According to various embodiments disclosed herein, a part of the housing made of a metal material may be configured as a glossy surface, and another part thereof may be configured as a matte surface, thereby implementing a double texture, and a uniform oxide film layer may be formed on the surface of the housing made of the metal material, thereby preventing the oxide film layer from being peeled off by external stress, or may prevent surface corrosion thereof.

According to various embodiments disclosed herein, a double texture may be implemented with the metal material, and a polymer material adjacent to the metal material may be made to have a uniform texture, thereby providing an aesthetically pleasant appearance of the electronic device.

DETAILED DESCRIPTION

Various embodiments of the disclosure may provide a housing configured to have at least two types of metal surface textures, and an electronic device including the same. Hereinafter, various embodiments of the disclosure may be described with reference to the accompanying drawings.

Figure 1:
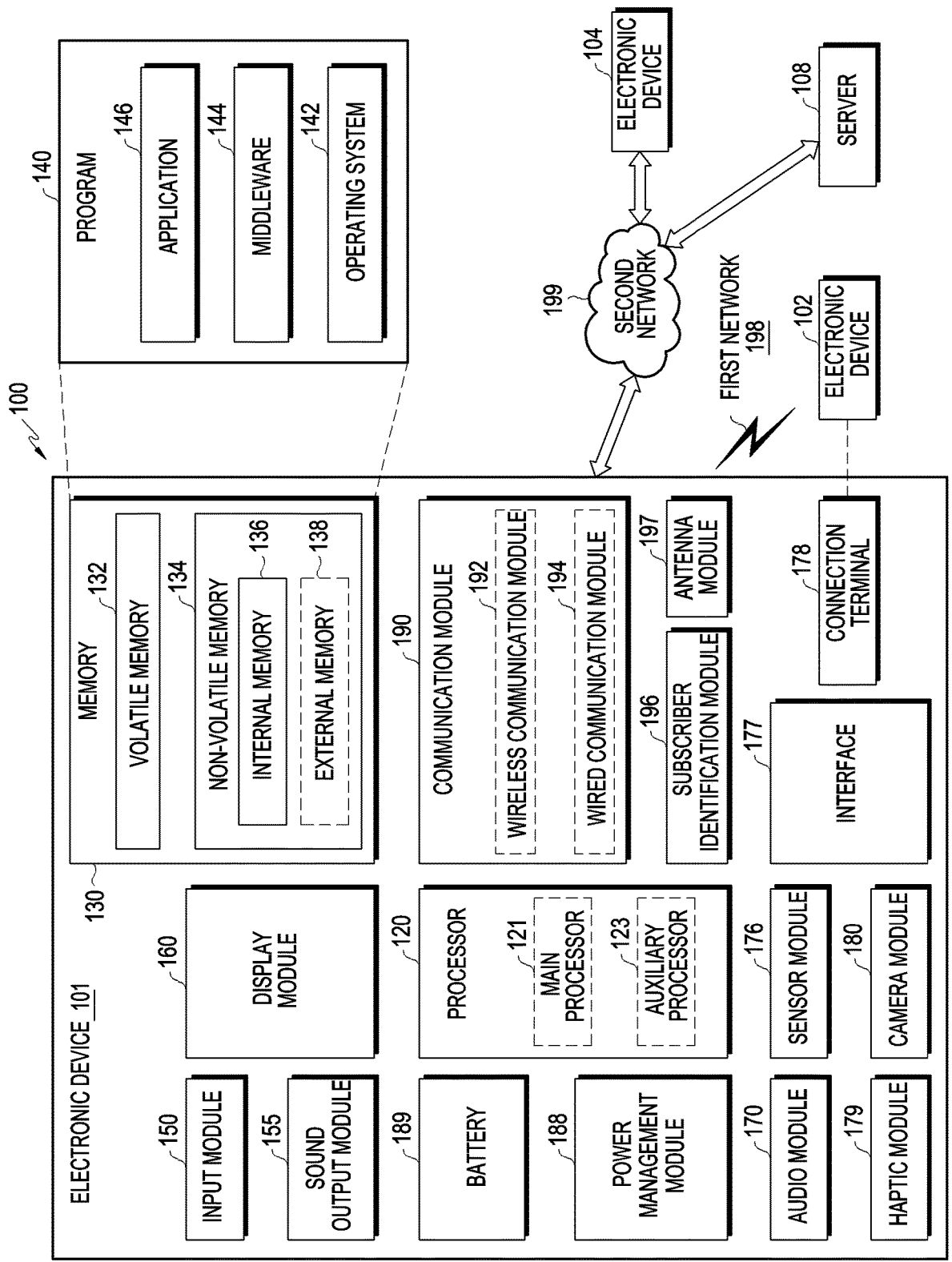
FIG. 1 is a block diagram illustrating an electronic device in a network environment according to various embodiments disclosed herein.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., an electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
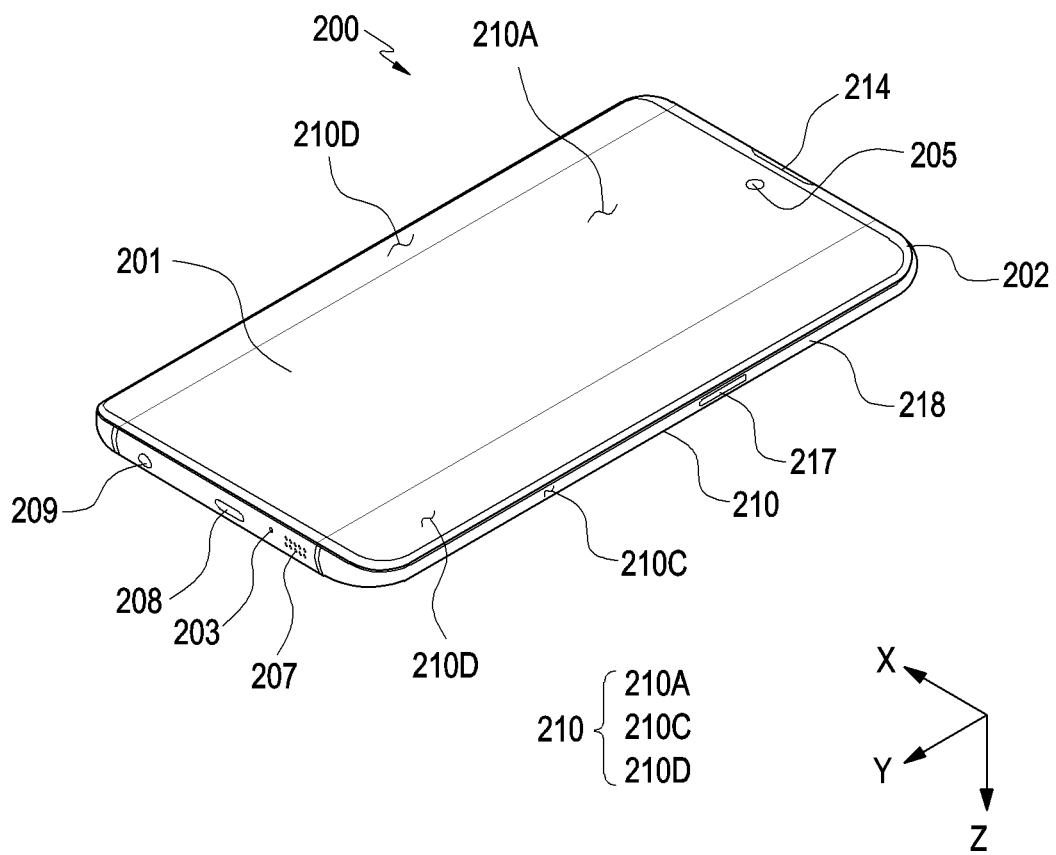
FIG. 2 is a front perspective view of an electronic device according to various embodiments disclosed herein.
Figure 3:
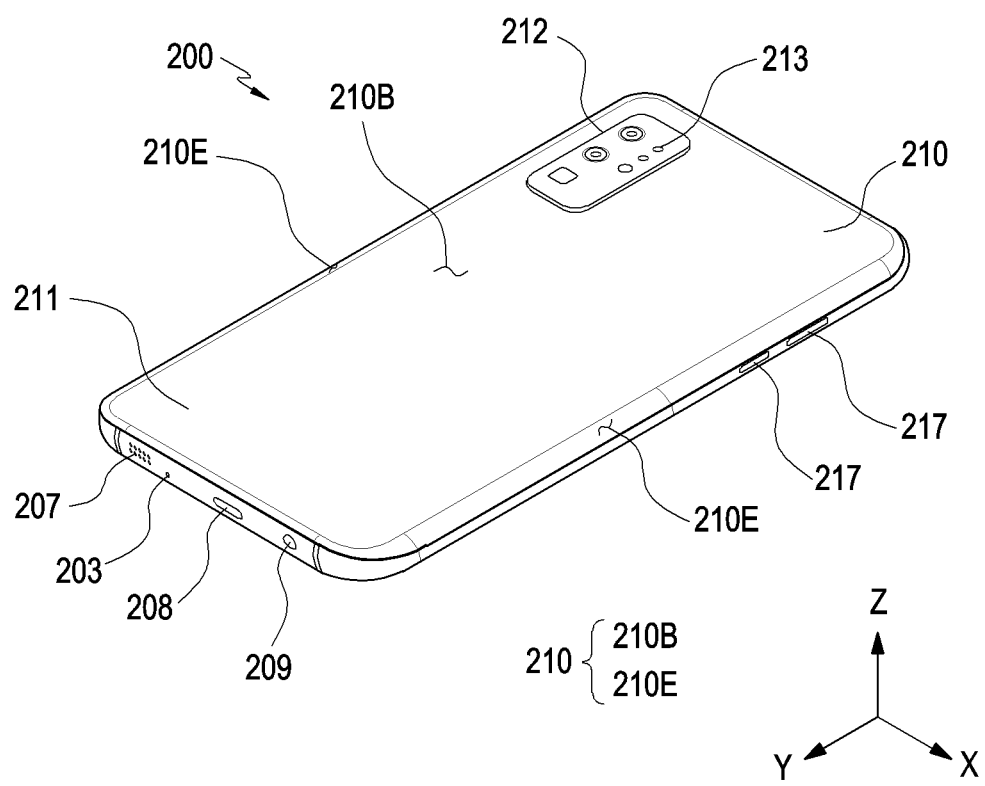
FIG. 3 is a rear perspective view of an electronic device according to various embodiments disclosed herein.

FIG. 2 is a front perspective view of an electronic device 200 according to various embodiments disclosed herein. FIG. 3 is a rear perspective view of an electronic device 200 according to various embodiments disclosed herein.

FIG. 2 and drawings following FIG. 2 show a spatial coordinate system defined by an X-axis, a Y-axis, and Z-axis orthogonal to each other. The X-axis may represent the width direction of the electronic device 200, the Y-axis may represent the length direction of the electronic device 200, and the Z-axis may represent the height (or thickness) direction of the electronic device 200. In the description below, the "first direction" may refer to the direction parallel with the Y-axis or the Z-axis.

Referring to FIG. 2 and FIG. 3, the electronic device 200 (e.g.: electronic device 101 of FIG. 1) according to an embodiment may include a housing 210 including a front surface 210A, a rear surface 210B, and a lateral surface 210C surrounding a space between the front surface 210A and the rear surface 210B. According to another embodiment (not shown), the housing 210 may refer to a structure for configuring a portion of the front surface 210A in FIG. 2, and the rear surface 210B and the lateral surface 210C in FIG. 3. According to an embodiment, at least a portion of the front surface 210A may be formed by a substantially transparent front plate 202 (e.g.: glass plate including various coating layers or polymer plate). The rear surface 210B may be formed by a rear plate 211. The rear plate 211 may be made of, for example, glass, ceramic, polymers, metals (e.g.: aluminum, stainless steel (STS), or magnesium), or a combination of at least two thereof. The lateral surface 210C may be coupled to the front plate 202 and the rear plate 211 and may be implemented by a lateral bezel structure (or "lateral member) 218 including metal and/or polymer. In an embodiment, the rear plate 211 and the lateral bezel structure 218 may be integrally formed and include the same material (e.g.: glass, metal material such as aluminum, or ceramic).

In the embodiment shown in the drawing, the front plate 202 may include two first edge areas 210D bent toward the rear plate 211 from the front surface 210A to seamlessly extend and disposed at the opposite ends of a long edge of the front plate 202. In the embodiment (see FIG. 3), the rear plate 211 may include two second edge areas 210E bent toward the front plate 202 to be seamlessly extending from the rear plate 210B and disposed at the opposite ends of a long edge. In an embodiment, the front plate 202 (or rear plate 211) may include only one of the first edge areas 210D (or second edge areas 210E). In another embodiment, a portion of the first edge areas 210D and the second edge areas 210E may not be included. In the embodiment described above, when view from the side of the electronic device 101, the lateral bezel structure 218 may have a first thickness (or width) at a lateral side in which the first edge areas 210D or the second edge areas 210E are not included, and a second thickness smaller than the first thickness at a lateral side in which the first edge areas 210D and the second edge areas 210E are included.

According to an embodiment, the electronic device 200 may include at least one of a display 201, an audio module 203, 207, or 214 (e.g.: audio module 170 of FIG. 1), a sensor module (e.g.: sensor module 176 of FIG. 1), a camera module 205, 212, or 213 (e.g.: camera module 180 of FIG. 1), a key input device 217 (e.g.: input module 150 of FIG. 1), and a connector hole 208 or 209 (e.g.: connection terminal 178 of FIG. 1). In an embodiment, the electronic device 200 may omit at least one of the components (e.g.: connector hole 209) or additionally include another component.

According to an embodiment, the display 201 may be exposed to outside through, for example, a substantial portion of the front plate 202. In an embodiment, at least a portion of the display 201 may be exposed through the front plate 202 configured to form the front surface 210A and the first edge areas 210D. According to an embodiment, an edge of the display 201 may be formed to be substantially identical to a shape of an outer periphery adjacent to the front plate 202. According to another embodiment (not shown), in order to expand an area through which the display 201 is exposed, the gap between the outer periphery of the display 201 and the outer periphery of the front plate 202 may be formed to be substantially identical.

According to an embodiment, the surface (or front plate 202) of the housing 210 may include a screen display area formed as the display 201 is visually exposed. By way of example, the display area may include the front surface 210A and the first edge areas 210D.

In another embodiment (not shown), the display 201 may have a recess or an opening formed on a portion of the screen display area (e.g.: front surface 210A and first edge area 210D) and include at least one of an audio module 214, a sensor module (not shown), a light-emitting element (not shown), and a camera module 205, which are arranged with the recess or the opening. In another embodiment (not shown), the display 201 may include at least one of an audio module 214, a sensor module (not shown), a camera module 205, a fingerprint sensor (not shown), and an light-emitting element (not shown) on the rear surface of the screen display area.

According to an embodiment (not shown), the display 201 may be combined to or disposed adjacent to a touch sensing circuit, a pressure sensor for measuring a strength (pressure) of a touch, and/or a digitizer for detecting a magnetic field-type stylus pen.

In an embodiment, at least a portion of the key input device 217 may be disposed at the first edge areas 210D and/or the second edge areas 210E.

According to an embodiment, the audio module 203, 207, or 214 may include, for example, a microphone hole 203 and a speaker hole 207 or 214. A microphone for obtaining a sound from outside may be disposed in the microphone hole 203, and in an embodiment, multiple microphones may be arranged to detect a direction of a sound. The speaker hole 207 or 214 may include an outer speaker hole 207 and a receiver hole 214 for calling. In an embodiment, the speaker hole 207 or 214 and the microphone hole 203 may be implemented into one hole and a speaker may be included without a speaker hole 207 or 214 (e.g.: piezo speaker). The audio module 203, 207, and 214 is not limited to the structure described above and may be changed to various forms such that a portion of the audio module is mounted or a new audio module is added depending on the structure of the electronic device 200.

According to an embodiment, a sensor module (not shown) may generate an electrical signal or a data value corresponding to an internal operation state or external environment state of the electronic device 200. The sensor module (not shown) may include, for example, a first sensor module (not shown) (e.g.: proximity sensor) and/or a second sensor module (not shown) (e.g.: fingerprint sensor) disposed at the front surface 210A of the housing 210 and/or a third sensor module (not shown) (e.g.: HRM sensor) and/or a fourth sensor module (not shown) (e.g.: fingerprint sensor) disposed at the rear surface 210B of the housing 210. In an embodiment (not shown), the fingerprint sensors may be disposed at the rear surface 210B as well as at the front surface 210A (e.g.: display 201) of the housing 210. The electronic device 200 may further include at least one sensor module not shown in the drawings, for example, a gesture sensor, a gyro sensor, an air pressure sensor, a magnetic sensor, an acceleration sensor, a grip sensor, a color sensor, an infrared (IR) sensor, a biometric sensor, a temperature sensor, humidity sensor, or an illuminance sensor (not shown). The sensor module (not shown) is not limited to the structure described above and may be changed to various forms such that a portion of the sensor module is mounted, or a new sensor module is added depending on the structure of the electronic device 200.

According to an embodiment, the camera module 205, 212, or 213 may include, for example, a front camera module 205 disposed at the front surface 210A of the electronic device 200 and a rear camera module 212 and/or a flash 213 disposed on the rear surface 210B. The camera module 205 or 212 may include one or more of lenses, an image sensor, and/or an image signal processor. The flash 213 may include, for example, a light-emitting diode or a xenon lamp. In an embodiment, two or more lenses (infrared camera, wide-angle, and telephoto lens) and image sensors may be arranged on one surface of the electronic device 101. The camera module 205, 212, and 213 is not limited to the structure described above and may be changed to various forms such that a portion of the camera module is mounted, or a new camera module is added depending on the structure of the electronic device 101.

According to an embodiment, the electronic device 200 may include multiple camera modules (e.g.: dual camera, or triple camera) each having different attributes (e.g.: angle of view) or functions. For example, multiple camera modules 205 and 212 may include lenses with different angles of view, and the electronic device 101 may control, based on the user's selection, to change the angle of view of the camera module 205 or 212 operated in the electronic device 101. For example, at least one of the multiple camera modules 205 and 212 may be a wide-angle camera and at least one thereof may be a telephoto camera. Similarly, at least one of the multiple camera modules 305 and 312 may be a front camera and at least one thereof may be a rear camera. In addition, the multiple camera modules 205 and 212 may include at least one of a wide-angle camera, a telephoto camera, or an infrared (IR) camera (e.g.: time of flight (TOF) camera, structured light camera). According to an embodiment, the IR camera may be operated as at least a portion of the sensor module. For example, the TOF camera may be operated as at least a portion of the sensor module (not shown) to detect the distance to a subject.

According to an embodiment, the key input device 217 may be disposed on the lateral surface 210C of the housing 210. According to another embodiment, the electronic device 200 may not include a portion or entirety of the key input device 217 described above, and the excluded key input device 217 may be implemented as various forms such as a soft key on the display 201. In an embodiment, the key input device may include a sensor module (not shown) disposed at the rear surface 210B of the housing 210.

According to an embodiment, a light-emitting element (not shown) may be disposed at the front surface 210A of the housing 210. The light-emitting element (not shown) may provide state information of the electronic device 200 in a form of light, for example. In another embodiment, the light-emitting element (not shown) may provide, for example, a light source interlocking with an operation of the front camera module 205. The light-emitting element (not shown) may include, for example, a light-emitting diode (LED), an infrared LED (IR LED), and a xenon lamp.

According to an embodiment, the connector hole 208 and 209 may include, for example, a first connector hole 208 capable of receiving a connector (for example, USB connector) for transmitting or receiving power and/or data to or from an external electronic device, and/or a second connector hole 209 (for example, earphone jack) capable of receiving a connector for transmitting or receiving an audio signal to or from an external electronic device. The connector hole 208 and 209 is not limited to the structure described above and may be changed to various forms such that a portion of the connector hole is mounted, or a new connector hole is added depending on the structure of the electronic device 200.

According to an embodiment, the camera module 205 and/or the sensor module (not shown) may be disposed in the inner space of the electronic device 200 to be in contact with the external environment through a predetermined area of the front plate 202 and the display 201. For example, the predetermined area may be an area in which a pixel is not disposed in the display 201. For another example, the predetermined area may be an area in which a pixel is disposed in the display 201. When the display 201 is viewed from above, at least of a portion of the predetermined area may overlap the camera module 205 and/or the sensor module. For another example, some of the sensor module may be disposed in the inner space of the electronic device to perform functions thereof without visually exposing through the front plate 202.

Figure 4:
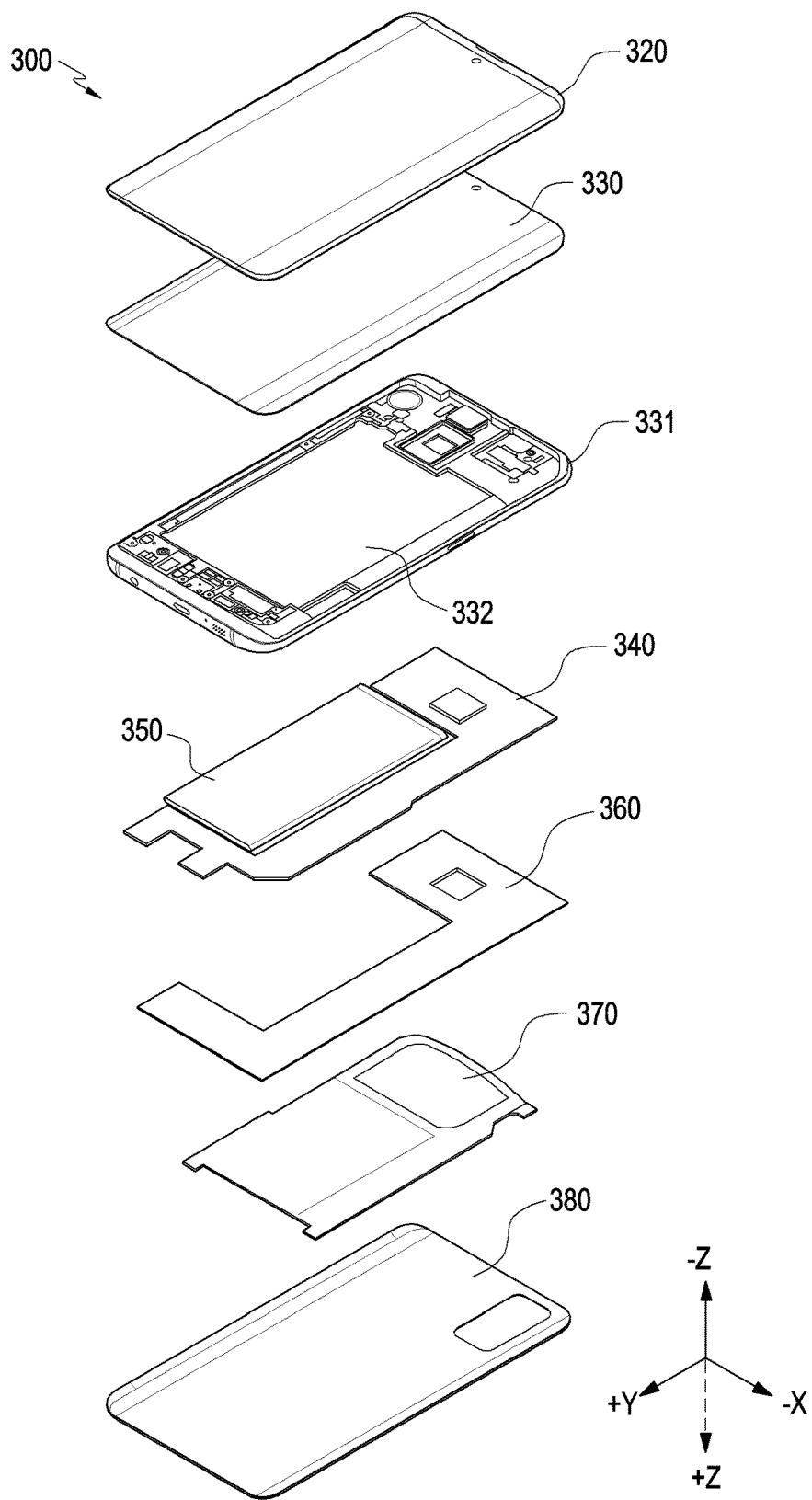
FIG. 4 is an exploded perspective view of an electronic device according to various embodiments disclosed herein.

FIG. 4 is an exploded perspective view of an electronic device 300 according to various embodiments of the disclosure.

Referring to FIG. 4, the electronic device 300 (e.g.: electronic device 101 in FIG. 1 or electronic device 200 in FIG. 2) may include a front plate 320 (e.g.: front plate 202 in FIG. 2), a display 330 (e.g.: display 201 in FIG. 2), a first support member 332 (e.g.: bracket), a main printed circuit board 340 (e.g.: PCB, flexible PCB (FPCB), or rigid flexible PCB (RFPCB)), a battery 350, a second support member 360 (e.g.: rear case), an antenna 370, and a rear plate 380 (e.g.: rear plate 211 in FIG. 3). In an embodiment, the electronic device 300 may omit at least one of the components (e.g.: first support member 332 or second support member 360) or additionally include another component. At least one of the components of the electronic device 300 may be the same as or similar to at least one of the components of the electronic device 200 in FIG. 2 or FIG. 3, and thus the overlapping description thereof will be omitted.

According to an embodiment, the first support member 332 may be disposed in the electronic device 300 to be connected to the lateral bezel structure 331 or integrally formed with the lateral bezel structure 331. The first support member 332 may be made of a metal material and/or a non-metal (e.g.: polymer) material. The first support member 332 may have the display 330 coupled to one surface thereof and the printed circuit board 340 coupled to the other surface thereof. A processor, a memory, and/or an interface may be mounted to the printed circuit board 340. The processor may include, for example, one or more of a central processing device, an application processor, a graphic process device, an image signal processor, a sensor hub processor, or a communication processor. According to an embodiment, the printed circuit board 340 may include a flexible printed circuit board type radio frequency cable (FRC). For example, the printed circuit board 340 may be disposed on at least a portion of the first support member 332 and may be electrically connected to an antenna module (e.g.: antenna module 197 in FIG. 1) and a communication module (e.g.: communication module 190 in FIG. 1).

According to an embodiment, the memory may include, for example, a volatile memory and a nonvolatile memory.

According to an embodiment, the interface may include, for example, a high-definition multimedia interface (HDMI), a universal serial bus (USB) interface, an SD card interface, and/or an audio interface. The interface may electrically or physically connect the electronic device 101 to an external electronic device, and may include, for example, a USB connector, SD card/MMC connector, or an audio connector.

According to an embodiment, the battery 350 is a device for supplying power to at least one component of the electronic device 300, and may include, for example, a non-rechargeable primary battery, or a rechargeable secondary battery, or a fuel cell. At least a portion of the battery 350 may be disposed on the substantially same plane as the printed circuit board 340. The battery 350 may be disposed and integrally formed in the electronic device 300 or may be disposed to be attachable to/detachable from the electronic device 300.

According to an embodiment, the second support member 360 (e.g.: rear case) may be disposed between the printed circuit board 340 and the antenna 370. For example, the second support member 360 may include one surface to which at least one of the printed circuit board 340 or the battery 350 is coupled and the other surface to which the antenna 370 is coupled.

According to an embodiment, the antenna 370 may be disposed between the rear plate 380 and the battery 350. The antenna 370 may include, for example, a near field communication (NFC) antenna, a wireless charge antenna, and/or a magnetic secure transmission (MST) antenna. The antenna 370, for example, may perform a near field communication with an external electronic device or wirelessly transmit and receive power required for charging. For example, the antenna 370 may include a coil for wireless charging. In another embodiment, an antenna structure may be formed of a portion or a combination of the lateral bezel structure 331 and/or the first support member 332.

According to an embodiment, the rear plate 380 may implement at least a portion of the rear surface (e.g.: rear surface 210B in FIG. 3) of the electronic device 300.

The electronic device 200 or 300 disclosed in FIG. 2 to FIG. 4 has a bar type or a plate type appearance, but is not limited thereto. For example, the electronic device shown in the drawings may be a portion of a rollable electronic device or a foldable electronic device. The "rollable electronic device" may refer to an electronic device in which a display (e.g.: display 330 in FIG. 4) is bendable and transformable so that at least a portion thereof can be wound or rolled to be received in a housing (e.g.: housing 310 in FIG. 2). According to user needs, a screen display area of the rollable electronic device may be expanded to be used by unfolding the display or exposing more area of the display to the outside. The "foldable electronic device" may refer to an electronic device in which different two areas of the display may be folded in a direction to face each other or in a direction to face opposite directions from each other. Generally, in a mobile state, the different two areas of the display of the foldable electronic device are folded in a direction to face each other or in a direction to face opposite directions from each other, and in a use state, the user may unfold the display to make the two different areas form a substantially flat plate shape. In an embodiment, the electronic device 101 according to certain embodiment disclosed herein may be electronic devices such as a laptop computer or home appliances instead of a mobile electronic device such as a smartphone.

Figure 5:
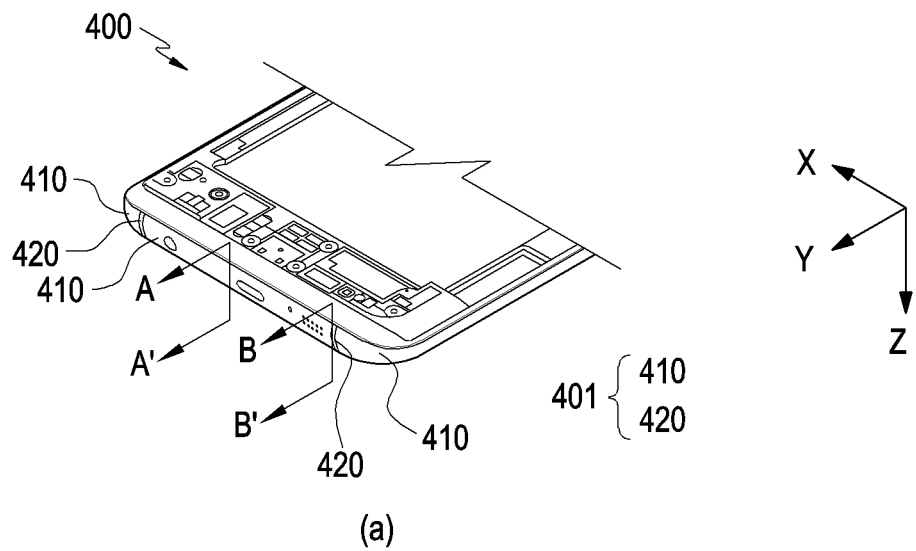
FIG. 5 is views illustrating a first portion and a second portion of a housing according to various embodiments disclosed herein.
Figure 5:
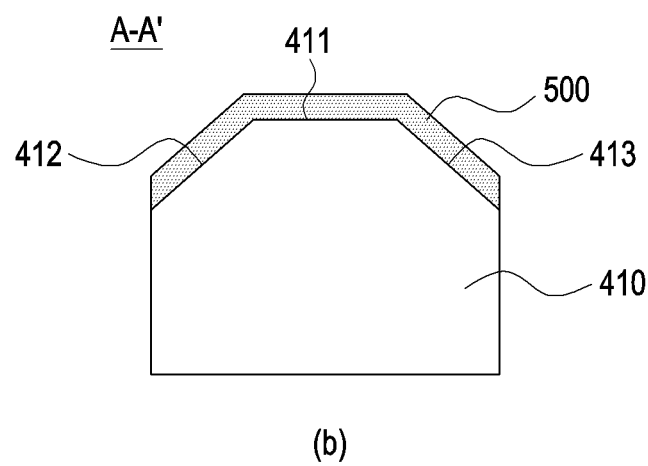
Figure 5:
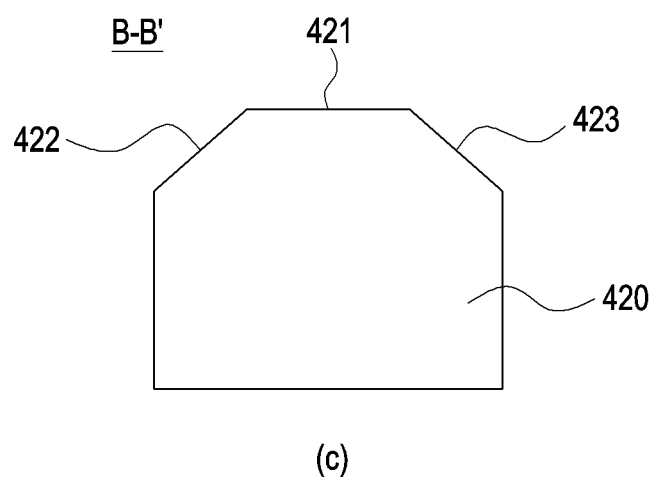

FIG. 5 is views illustrating a first portion 410 and a second portion 420 of a housing 401 (e.g.: housing 210 in FIG. 2) of an electronic device 400 according to various embodiments disclosed herein. FIG. 5A shows a perspective view of the housing 401 of the electronic device 400, FIG. 5B shows a cross-sectional view of the first portion 410, and FIG. 5C shows a cross-sectional view of the second portion 420. FIG. 5B and FIG. 5C show cross-sectional views of the housing 401 in FIG. 5A taken along direction A-A' and direction B-B', respectively.

Referring to FIG. 5A, the electronic device 400 may omit at least one of the components (e.g.: first support member 332 or second support member 360 in FIG. 4) of the electronic device 200 or 300 shown in FIG. 2 to FIG. 4 or additionally include another component. At least one of the components of the electronic device 400 may be the same as or similar to at least one of the components of the electronic device 200 and 300 in FIG. 2 or FIG. 4. The description overlapping with the description for FIG. 2 to FIG. 4 will be omitted below.

The housing 401 according to various embodiments of the disclosure may be the same as or similar to the housing 210 in FIG. 2 or FIG. 3. For the convenience of the description, the embodiment in FIG. 5A illustrates the housing 401 including only a lateral bezel structure (e.g.: lateral bezel structure having shape identical or similar to lateral bezel structure 218 in FIG. 2 or FIG. 3 and bezel structure 331 shown in FIG. 4), but is not limited thereto. For example, the housing 401 may include a front plate (e.g.: front plate 202 in FIG. 2 or front plate 320 in FIG. 4) and/or a rear plate (e.g.: rear plate 211 in FIG. 3 or rear plate 380 in FIG. 4) in addition to the lateral bezel structure shown in FIG. 5A.

According to various embodiments, the housing 401 may include a first portion 410 and the second portion 420. The first portion 410 and the second portion 420 may be arranged adjacent to each other and may be portions that distinguish the areas thereof from each other in the housing 401. According to an embodiment, as shown in FIGS. 5A to 5C, the first portion 410 and the second portion 420 may be formed to be distinguished from each other in the lateral bezel structure, but are not limited thereto. According to another embodiment, the first portion 410 and the second portion 420 may be formed to be distinguished from each other in the front plate or the rear plate. According to another embodiment, the first portion 410 may be formed on a portion of the lateral bezel structure, the front plate, or the rear plate, and the second portion 420 may be formed on another portion of the lateral bezel structure, the front plate, or the rear plate. According to another embodiment, the first portion 410 and/or the second portion 420 may be formed on two or more portions of the lateral bezel structure, the front plate, or the rear plate.

According to various embodiments of the disclosure, at least a portion of the housing 401 may be made of an electrically conductive material to be used as an antenna.

According to an embodiment, the first portion 410 may be a portion including an electrically conductive material (e.g.: metal). The electrically conductive material included in the first portion 410 may correspond to, for example, an aluminum alloy, a magnesium alloy, a zinc alloy, a copper alloy, a titanium alloy, stainless steel, or an amorphous metal, or a combination thereof. The first portion 410 of the housing 401, which includes the electrically conductive material, may be electrically connected to a communication module (e.g.: communication module 190 in FIG. 1) disposed in the housing 401. According to an embodiment, the first portion 410 may form an antenna module (e.g.: antenna module 197 in FIG. 1) independently or in combination with other antennas disposed in the housing 401 so as to transmit/receive signals or power to/from an external device.

According to various embodiments of the disclosure, the second portion 420 may be a portion including an insulating material. The second portion 420 including the insulating material may serve to limit conduction between some components and other components of the electronic device 400. When the housing of the electronic device 400 includes an electrically conductive material, the second portion 420 may be used to electrically disconnect some components from other components of the housing, and thus enabling at least a portion of the housing of the electronic device 400 to function as an antenna. For example, when the first portion 410 includes an electrically conductive material and the second portion 420 including an insulating material is disposed adjacent to the first portion 410, the second portion 420 may be used to insulate the first portion 410 from other parts of the housing 401, and the first portion 410 may be utilized as an antenna.

According to various embodiments, the second portion 420 may be a portion made by filling a slit formed on the lateral bezel structure and/or the rear plate of the electronic device 400 with an insulating material. The slit may have a predetermined width and extend from one portion to another portion on the lateral bezel structure and/or the rear plate. The slit, as shown in FIG. 5A, may be elongated from the top to the bottom of the lateral bezel structure. The slit may have a continuously extending shape, but may also have a shape having a discrete end. FIG. 5A shows that the two slits are formed on the lateral bezel structure of the electronic device 400 and filled with the insulating material, thus two second portions 420 are formed. The two second portions 420 are arranged to be spaced a pre-configured distance apart from each other. The number, position, or shape of the slits and the second portions 420 obtained by filling the slits with an insulating material are not limited to any specific embodiment including the embodiment in FIG. 5, and may vary according to different embodiments.

According to various embodiments of the disclosure, the first portion 410 may include a first surface 411 and a second surface 412. The first surface 411 and the second surface 412 may face the same direction (e.g.: first direction) or face different directions from each other. For example, referring to FIG. 5B, when the first surface 411 faces a first direction, the second surface 412 may face a second direction different from the first direction. Hereinafter, as shown in FIG. 5B, the embodiment in which the first surface 411 and the second surface 412 face different directions from each other will be mainly described.

The first surface 411 may correspond to one surface of the housing 210 of the electronic device 200 shown in FIG. 2 and FIG. 3. For example, the first surface 411 may correspond to one of the front surface (e.g.: front surface 210A in FIG. 2), the rear surface (e.g.: rear surface 210B in FIG. 3), and the lateral surface (e.g.: lateral surface 210C in FIG. 2) of the electronic device 200 shown in FIG. 2 and FIG. 3. By way of example, the first surface 411 may be the lateral surface (e.g.: lateral surface 210C in FIG. 2) of the electronic device. The second surface 412 may correspond to another surface other than the one surface of the housing 210 of the electronic device 200 shown in FIG. 2 and FIG. 3. For example, when the first surface 411 is the lateral surface (e.g.: lateral surface 210C in FIG. 2) of the electronic device, the second surface 412 may be one of the front surface (e.g.: front surface 210A in FIG. 2) of the electronic device or the rear surface (e.g.: rear surface 210B in FIG. 3) of the electronic device.

According to an embodiment, the first surface 411 may correspond to the lateral surface (e.g.: lateral surface 210C in FIG. 2) of the electronic device and the second surface 412 may correspond to the rear surface (e.g.: rear surface 210B in FIG. 3) of the electronic device. In this case, the first surface 411 may form at least a portion of the lateral bezel structure in the housing 401 of the electronic device 400 and the second surface 412 may form a portion of the rear plate in the housing 401 of the electronic device 400.

However, the disclosure is not necessarily limited thereto. According to another embodiment, the first surface 411 may correspond to the lateral surface (e.g.: lateral surface 210C in FIG. 2) of the electronic device and the second surface 412 may correspond a surface adjacent to the rear surface, and thereby the first surface 411 and the second surface 412 may both correspond to the lateral surface (e.g.: lateral surface 210C in FIG. 2) of the electronic device. In this case, both the first surface 411 and the second surface 412 may form a portion of the lateral bezel structure in the housing 401 of the electronic device 400. That is, the lateral bezel structure may include the first surface 411 and the second surface 412 different from each other.

According to another embodiment, the first surface 411 may correspond to two or more surfaces among a front surface (e.g.: front surface 210A in FIG. 2), the rear surface (e.g.: rear surface 210B in FIG. 3), and the lateral surface (e.g.: lateral surface 210C in FIG. 2) of the electronic device 200 shown in FIG. 2 and FIG. 3. For example, the first surface 411 may form a portion of the lateral bezel structure and the rear plate of the electronic device. Description for the second surface 412 is also applicable to this embodiment. FIG. 5B shows that both the first surface 411 and the second surface 412 are flat, but are not limited thereto. For reference, FIG. 5A shows that the surface of the housing 401 includes a curved surface. In such a case, the first surface 411 and/or the second surface 412 may include a curved surface. According to other embodiments, the first surface 411 and/or the second surface 412 may include both a flat surface and a curved surface.

According to various embodiments, the first surface 411 may be one portion of a metal base material or may be formed by processing the metal base material. and the second surface 412 is the other portion of the metal base material or may be formed by processing the first surface 411.

According to various embodiments, the first portion 410 may further include at least one surface in addition to the first surface 411 and the second surface 412. For example, the at least one surface may include a third surface 413. According to an embodiment, the third surface 413 is a portion different from the first surface 411 and the second surface 412, and may face a third direction different from the direction that the first surface 411 faces and the direction that the second surface 412 faces. According to an embodiment, when the first surface 411 corresponds to the lateral surface (e.g.: lateral surface 210C in FIG. 2) of the electronic device and the second surface 412 corresponds to the rear surface (e.g.: rear surface 210B in FIG. 3) of the electronic device, the third surface 413 may correspond to the front surface (e.g.: front surface 210A in FIG. 2) of the electronic device. In this case, the first surface 411 may correspond the lateral bezel structure in the housing 401 of the electronic device 400, the second surface 412 may correspond to the rear plate in the housing 401 of the electronic device 400, and the third surface 413 may correspond to the front plate in the housing 401 of the electronic device 400. According to another embodiment, when the second surface 412 corresponds to the front plate, the third surface 413 may correspond to the rear plate in the housing 401 of the electronic device 400. According to another embodiment, the first surface 411 may correspond to two or more surfaces among a front surface (e.g.: front surface 210A in FIG. 2), the rear surface (e.g.: rear surface 210B in FIG. 3), and the lateral surface (e.g.: lateral surface 210C in FIG. 2) of the electronic device 200 shown in FIG. 2 and FIG. 3. For example, the first surface 411 may form a portion of the lateral bezel structure and the rear plate of the electronic device. In this case, the second surface 412 may form another portion of the rear plate of the electronic device and the third surface 413 may form another portion of the front plate or the lateral bezel structure. Likewise, the disposition and shape of each surface may vary according to an embodiment.

In embodiments below, as shown in FIG. 5B, the first surface 411, the second surface 412, and the third surface 413 will be described as for the example of multiple surfaces, but are not limited thereto, and it should be noted that more surfaces may be included.

According to various embodiments of the disclosure, the second portion 420 may include a fourth surface 421 and a fifth surface 422. The fourth surface 421 and the fifth surface 422 may face the same direction (e.g.: first direction) or face different directions from each other. For example, referring to FIG. 5C, when the fourth surface 421 faces a first direction, the fifth surface 422 may face a second direction different from the first direction. The second portion 420 may further include a sixth surface 423 according to various embodiments. Here, the sixth surface 423 is a portion different from the fourth surface 421 and the fifth surface 422, and may face a third direction different from the direction that the fourth surface 421 faces and the direction that the fifth surface 422 faces. The description for the first portion 410 may be applied to the description for the multiple surfaces included in the second portion 420.

According to various embodiments, the second portion 420 may be disposed adjacent to the first portion 410. In describing various embodiments of the disclosure, "adjacent" may refers to when a certain element is disposed close to another element. In addition, "adjacent" may refer to a state in which a certain element is in close or almost contact with another element while being spaced a predetermined distance apart from the other element. Hereinafter, an embodiment in which the first portion 410 and the second portion 420 are in contact with each other will be described as an example. However, it should be noted that this does not exclude the disposition of another component (e.g.: other portions of housing) between one component (e.g.: first portion 410) and another component (e.g.: second portion 420).

In addition, the shape of the second portion 420 may correspond to the shape of the first portion 410. For example, when the first portion 410 includes the first surface 411 facing the first direction, the second surface 412 facing the second direction, and the third surface 413 facing the third direction, the second portion 420 may include the fourth surface 421 facing the first direction, the fifth surface 422 facing the second direction, and the sixth surface 423 facing the third direction, and thus have a shape corresponding to the first portion 410. The second portion 420 may be formed so as not offset from the first portion 410 when disposed adjacent to the first portion 410 so that the appearance of the electronic device 400 can be seen as being seamless to a user. To this end, the fourth surface 421 of the second portion 420 may be formed to be not offset from the first surface 411 of the first portion 410, the fifth surface 422 of the second portion 420 may be formed to be not offset from the second surface 412 of the first portion 410, and the sixth surface 423 of the second portion 420 may be formed to be not offset from the third surface 413 of the first portion 410. According to an embodiment, the first surface 411 of the first portion 410 may be connected substantially seamlessly with the fourth surface 421 of the second portion 420, the second surface 412 of the first portion 410 with the fifth surface 422 of the second portion 420, and the third surface 413 of the first portion 410 with the sixth surface 423 of the second portion 420. According to various embodiments of the disclosure, an oxide film layer 500 may be formed on the first surface 411, the second surface 412, and the third surface 413 of the first portion 410 for surface protection. The thickness of the oxide film layer 500 is exaggerated in the drawing, and the oxide film layer 500 according to certain embodiments of the disclosure may be formed to have a thickness of several µm to several tens of µm. Accordingly, even when the oxide film layer 500 is formed on the first portion 410, each of adjacent surfaces of the first portion 410 and the second portion 420 may be formed substantially not to be offset from each other.

As described above, the first portion 410 may include a conductive material, for example, metal. That is, the housing 401 of the electronic device according to various embodiments of the disclosure may include a metal surface. Various embodiments related to expressing two or more textures on the metal surface may be described with reference to FIG. 6 and following drawings.

Figure 6:
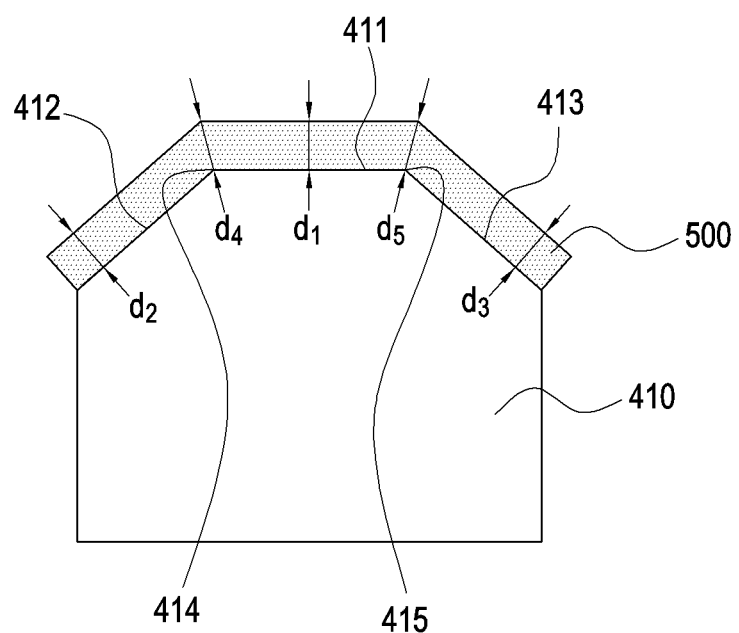
FIG. 6 is a cross-sectional view illustrating a first portion of a housing according to various embodiments disclosed herein.

FIG. 6 is cross-sectional view illustrating a first portion 410 of a housing (e.g.: housing 401 in FIG. 5A) according to various embodiments disclosed herein.

The first portion 410 according to various embodiments of the disclosure may be formed to have at least two textures. The term "texture" may refer to a state (e.g.: surface roughness) of the housing surface which can be visually or tactilely sensed by a user. For convenience of description, the following description will be given on the housing having a double texture, but with no limitation thereto, and it should be noted that the housing having three, four or more of textures may be included in the scope of the disclosure. According to an embodiment, the first surface 411 of the first portion 410 may be formed to have a first surface roughness and the second surface 412 may be formed to have a second surface roughness, thereby implementing the double texture. The second surface roughness of the second surface 412 may be lower than the first surface roughness. For example, the first surface 411 may be a matte surface which has a relatively high surface roughness, and the second surface 412 may be a glossy surface which has a relatively low surface roughness. According to various embodiments of the disclosure, both the matte surface and the glossy surface can be formed on a portion (e.g.: first portion 410) of the housing as described above, and thus the appearance may be variously designed.

According to various embodiments, the housing (e.g.: first portion 410), as shown in FIG. 6, may include a first connection portion 414 between the first surface 411 and the second surface 412. In an embodiment, the first connection portion 414 may be a boundary for distinguishing the first surface 411 and the second surface 412. In an embodiment, the texture of the first surface 411 and the texture of the second surface 412 may be distinguished with reference to the first connection portion 414. However, the disclosure is not necessarily limited thereto. According to another embodiment, contrary to what is shown in FIG. 6, the first connection portion 414 may be a curved surface having a pre-configured curvature R so as to seamlessly connect the first surface 411 and the second surface 412. According to various embodiments, it is possible that the first connection portion 414 has a pre-configured curvature R and the first surface 411 and the second surface 412 have a pre-configured curvature r so that a portion or entirety of the housing (e.g.: first portion 410) is formed to be a curved surface.

According to various embodiments of the disclosure, an oxide film layer 500 may be formed to protect each surface of the first portion 410 from a physical impact and/or chemical impact (e.g.: corrosion), and the oxide film layer 500 may be continuously formed on the multiple surfaces (e.g.: first surface 411, second surface 412, and third surface 413) of the first portion 410 without interruption. In addition, the oxide film layer 500 may have the same thickness on the multiple surfaces (e.g.: first surface 411, second surface 412, and third surface 413) of the first portion 410. For example, the thickness d1 of the oxide film layer 500 formed on the first surface 411, the thickness d2 of the oxide film layer 500 formed on the second surface 412, and the thickness d3 of the oxide film layer 500 formed on the third surface 413 may be formed to be identical to each other. Not only the thickness d1 of the oxide film layer 500 formed on the first surface 411, the thickness d2 of the oxide film layer 500 formed on the second surface 412, and the thickness d3 of the oxide film layer 500 formed on the third surface 413, but also the thickness d4 of the oxide film layer 500 formed on the first connection portion 414 between the first surface 411 and the second surface 412 and the thickness d5 of the oxide film layer 500 formed a second connection portion 415 between the first surface 411 and the third surface 413 may be uniform. Here, that the plurality of surfaces have substantially the same thickness may mean that two different surfaces form a thickness difference within a tolerance. For example, the first surface 411 and the second surface 412 may be formed to have a thickness difference within a 15 μm tolerance. If the thickness difference between the first surface 411 and the second surface 412 is out of tolerance, foreign substances may get stuck in a gap between the oxide film layers having different thicknesses, corrosion may occur due to moisture infiltrating into the gap, or the oxide film layers may be peeled off by external impacts to the housing.

As mentioned in Background Art, conventionally there is a difficulty in forming the oxide film layer 500 having uniform thickness during the process for implementing two kinds of textures on one metal surface, but according to various embodiments of the disclosure, it is possible to form the oxide film layer 500 to have the uniform thickness while expressing two or more of textures on one metal surface.

Hereinafter, the comparative embodiment will be described with reference to FIG. 7 to FIG. 8E, and a method for achieving an oxide film layer 500 having a uniform thickness according to various embodiments will be described with reference to FIG. 9 to FIG. 10B.

Figure 7:
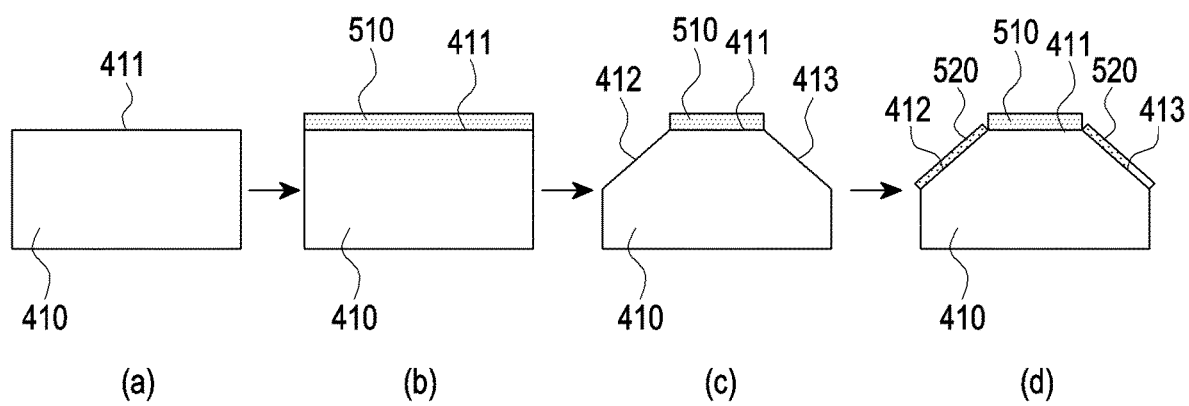
FIG. 7 is a view illustrating a process for implementing double texture on a first portion of a housing according to a certain embodiment.
Figure 8A:
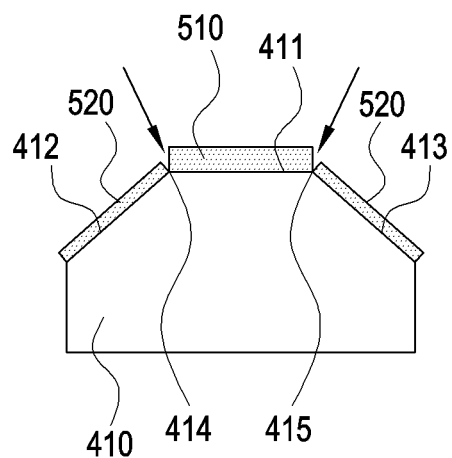
FIG. 8A is a view illustrating a first portion of a housing, having the double texture according to a certain embodiment.
Figure 8B:
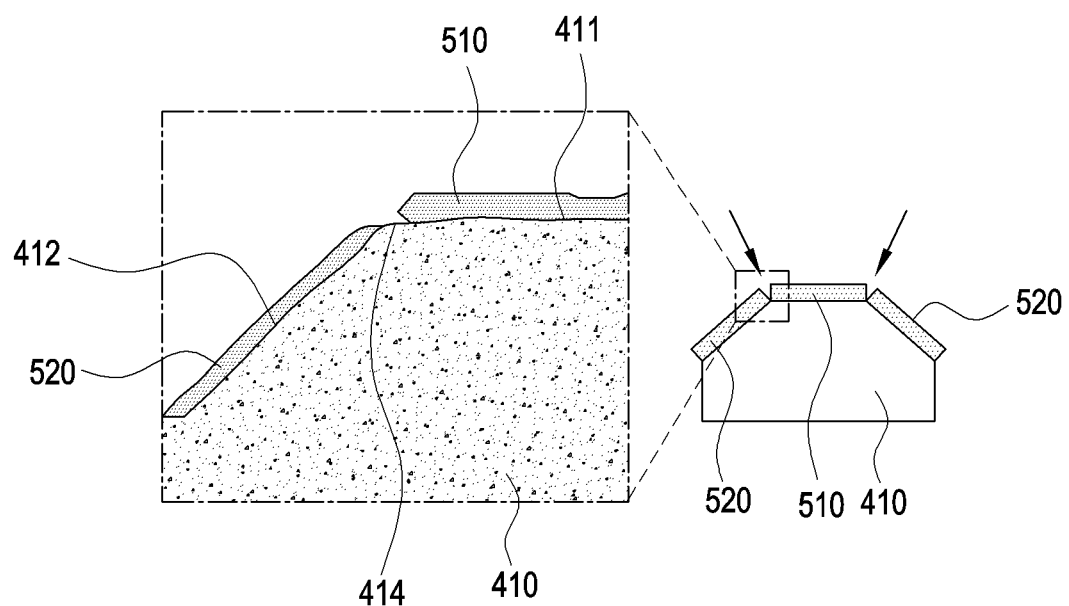
FIG. 8B is an enlarged view of a boundary portion between a second surface and a first surface illustrated in FIG. 8A.
Figure 8C:
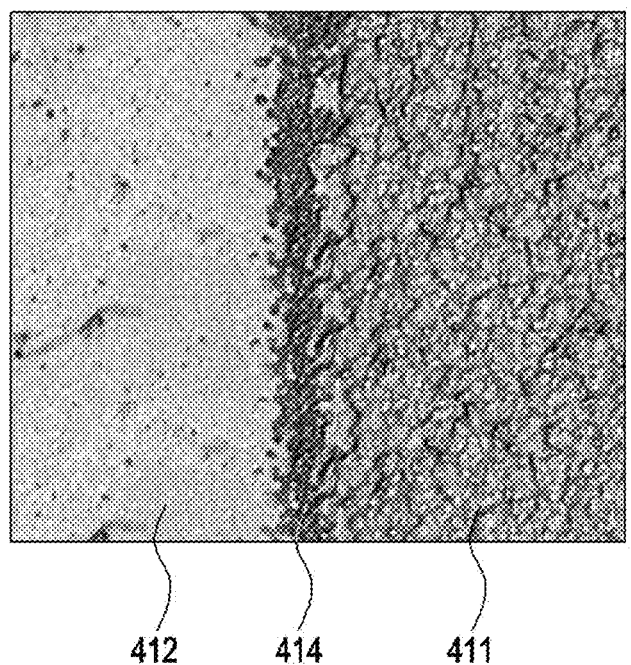
FIG. 8C is a view illustrating the portion illustrated in FIG. 8B viewed from above.
Figure 8D:
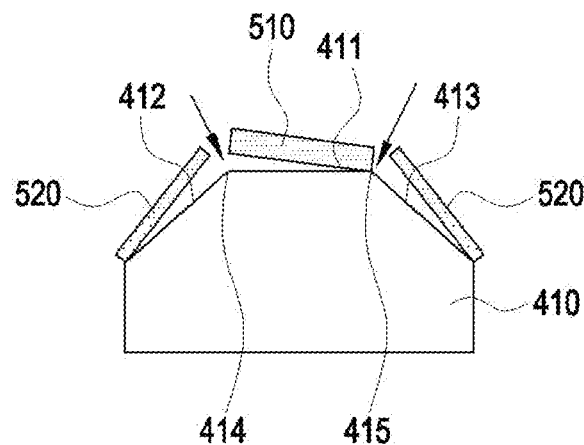
FIG. 8D is a conceptual view illustrating release of an oxide film layer from a first portion of a housing having double texture according to a certain embodiment.
Figure 8E:
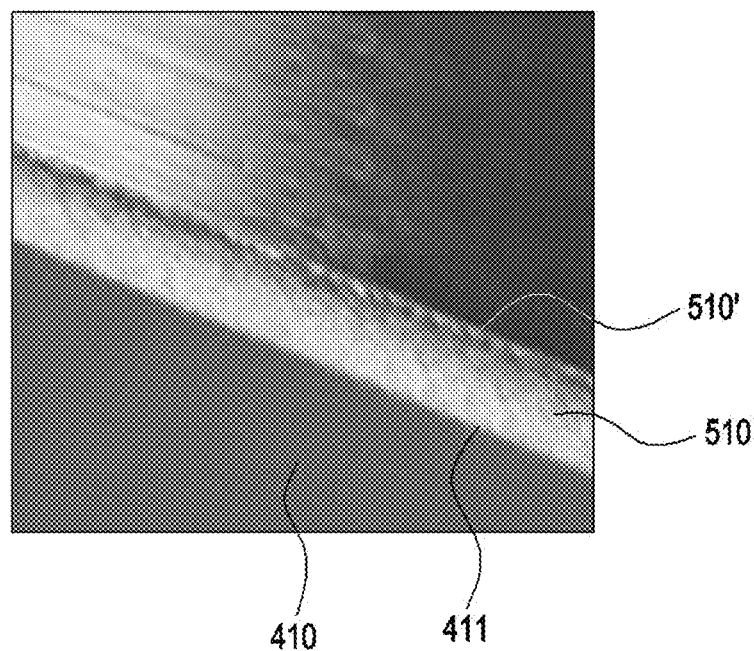
FIG. 8E is a photograph of a cross section of a first surface from which an oxide film layer is released according to a certain embodiment.

FIG. 7 is a view illustrating a process for implementing double texture on a first portion 410 of a housing according to a certain embodiment. FIG. 8A is a view illustrating a first portion of a housing having the double texture according to a certain embodiment. FIG. 8B is an enlarged view of a boundary portion between a second surface and a first surface illustrated in FIG. 8A. FIG. 8C is a view illustrating the portion illustrated in FIG. 8B viewed from above. FIG. 8D is a conceptual view illustrating release of an oxide film layer from a first portion of a housing, having double texture according to a certain embodiment. FIG. 8E is a photograph of a cross section of a first surface from which an oxide film layer is released according to a certain embodiment. FIG. 7 to FIG. 8E show a certain embodiment in which matte surface and glossy surface are formed on the first portion 410 of the housing.

According to an embodiment, as shown in FIG. 7A, a primary processing process may be performed on a base metal material of the first portion 410 to implementing the texture of a matte surface on the surface of the housing (e.g.: first portion 410). The first surface 411 may be formed by the primary processing process. The primary processing process may include forming bumps on the surface, such as sand blasting, for forming the matte appearance.

Referring to FIG. 7B, a surface uniformization process (e.g.: chemical polishing (CP)) may be performed to uniformize large and uneven bumps formed on the housing surface so as to achieve uniform gloss. A primary anodizing process may be performed to form an oxide film layer 510 for protecting the first surface 411 formed by the primary processing process. The primary anodizing process may be performed to prevent surface damage such as the first surface 411 being dented or scratched by by-product (e.g.: processing chip) generated in a secondary processing process, which will be described below, or corrosion of the base metal material by cutting oil during processing.

Referring to FIG. 7C, after the primary anodizing process, a secondary processing process may be performed to form a second surface 412 of the first portion 410 to implement glossy texture on the surface of the housing (e.g.: first portion 410) or additionally or alternatively to form a third surface 413. The secondary processing process may include polishing processing process for achieving smooth and elegant gloss. According to an embodiment, the surface uniformization processing process may be omitted because the surface uniformization processing process after the secondary processing process may remove the gloss.

Referring to FIG. 7D, the second oxide film layer 520 may be formed on the glossy second surface 412 and/or the third surface 413 by performing the secondary anodizing process.

Referring to FIG. 8A to FIG. 8C, according to a certain embodiment, a first oxide film layer 510 on the first surface 411 and a second oxide film layer 520 on the second surface 412 and/or the third surface 413 are formed by separate anodizing processes, and thus the continuity between the two oxide film layers may not exist. In addition, the second anodizing process (secondary anodizing process) may cause damage to the first oxide film layer 510 formed by the first anodizing process (primary anodizing process) by exposing the first oxide film layer 510 to acidic environment such as immersing it in sulfuric acid. Therefore, the oxide film layer formation by the second anodizing process needs to be proceeded in a short time period, and the second oxide film layer 520 may have difficulty growing beyond a certain thickness. As a result, the first oxide film layer 510 on the first surface 411 and the second oxide film layer 520 on the second surface 412 and/or the third surface 413 may have different thicknesses. Furthermore, the primary anodizing process is performed on the first surface 411 and the second anodizing process, separated from the primary processing process, is performed on the second surface 412 and/or the third surface 413, and thus it may be difficult to form the oxide film layer on the first connection portion 414 between the first surface 411 and the second surface 412 and the second connection portion 415 between the first surface 411 and the third surface 413. Referring to FIG. 8C, the first connection portion 414 between the first surface 411 and the second surface 412 does not have the oxide film layer formed thereon and thus may be damaged by foreign materials and/or external factors. Consequently, as shown in FIG. 8D, foreign materials or moisture may penetrate into the first connection portion 414 and the second connection portion 415, and cause the oxide film layer 510 and 520 to be released. By way of example, FIG. 8E shows that foreign material or moisture has penetrated into the oxide film layer 510 of the first connection portion 414 so that a portion 510' of the oxide film layer is released and lifted from the oxide film layer 510. This may cause deterioration of appearance (e.g.: gloss uniformity).

Figure 9:
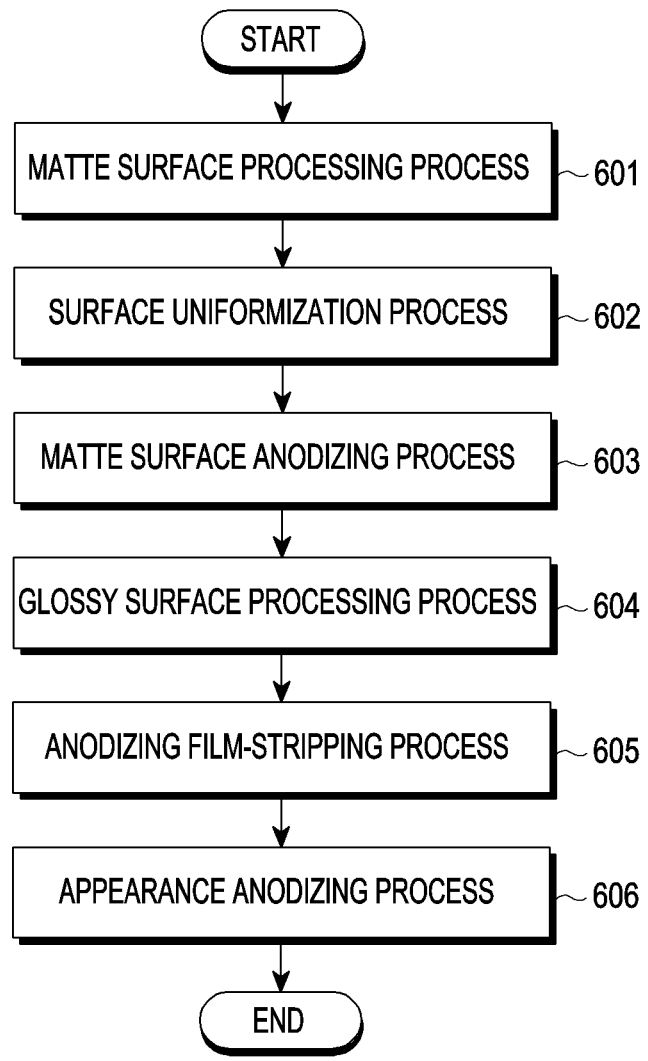
FIG. 9 is a flow chart illustrating a process for implementing double texture on a first portion of a housing according to various embodiments disclosed herein.

FIG. 9 is a flow chart illustrating a process for implementing double texture on a first portion 410 of a housing according to various embodiments disclosed herein. FIG. 10 is a view illustrating a process for implementing double texture on a first portion 410 of a housing according to various embodiments disclosed herein. FIG. 11A is a view of a first portion of a housing having double texture and an enlarged view of a boundary portion between a first surface and a second surface of the first portion according to an embodiment. FIG. 11B is a view of the portion illustrated in FIG. 11A viewed from above. FIG. 9 to FIG. 11B, similar to FIG. 7 to FIG. 8E, show an embodiment in which matte surface and glossy surface are formed on the first portion 410 of the housing.

Referring to FIG. 9, the method for manufacturing a housing of an electronic device according to various embodiments of the disclosure may include a primary processing process (e.g.: matte surface processing process 601) for allowing a first surface 411 of the housing having a first surface roughness, a primary anodizing process (e.g.: matte surface anodizing process 603) for forming an oxide film layer 510 on the first surface, a secondary processing process (e.g.: glossy surface processing process 604) for allowing a second surface 412 of the housing having a second surface roughness, an anodizing film-stripping process 605 of removing the oxide film layer 510 having formed on the first surface 411, and a secondary anodizing process (e.g.: appearance anodizing process 606) of forming an oxide film layer 520 on the first surface 411 and the second surface 412. According to an embodiment, a surface uniformization process 602 for surface uniformization of the first surface may be included before the primary anodizing process (e.g.: matter surface anodizing process 603).

Figure 10:
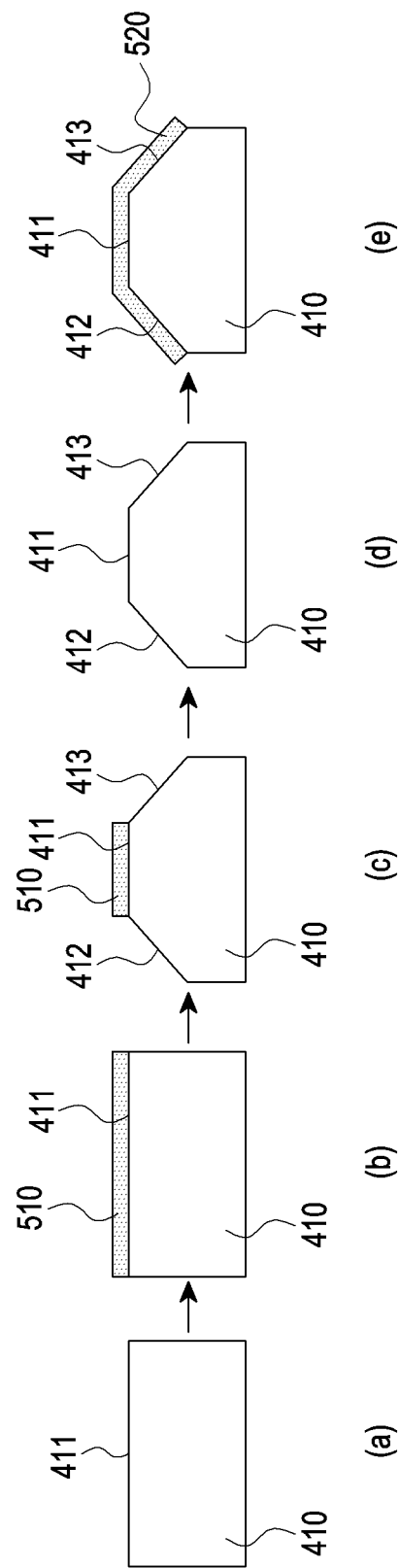
FIG. 10 is a view illustrating a process for implementing double texture on a first portion of a housing according to various embodiments disclosed herein.
Figure 11A:
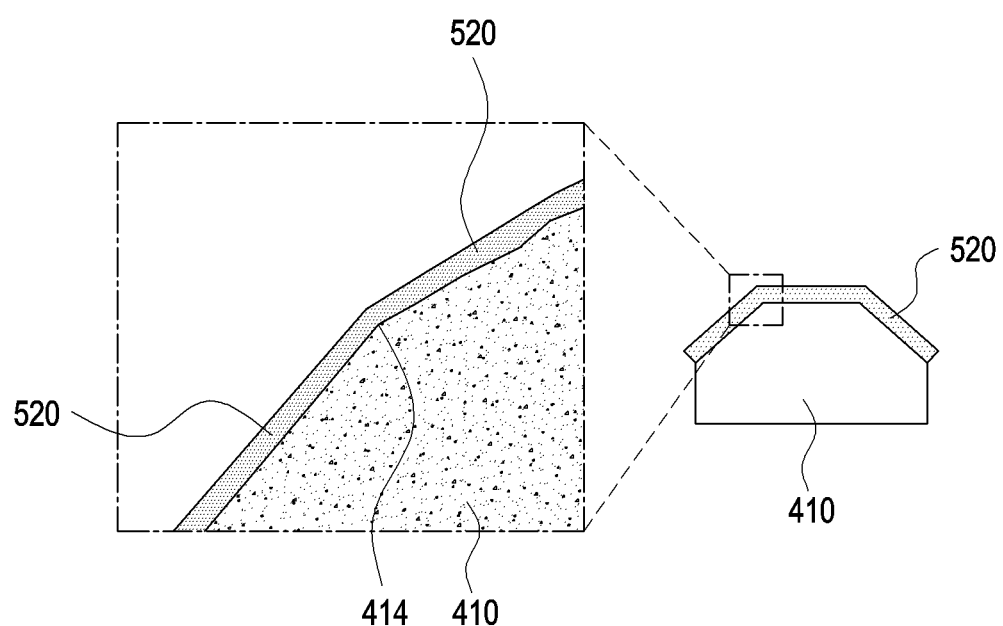
FIG. 11A is a view of a first portion of a housing having double texture and an enlarged view of a boundary portion between a first surface and a second surface of the first portion according to various embodiments.
Figure 11B:
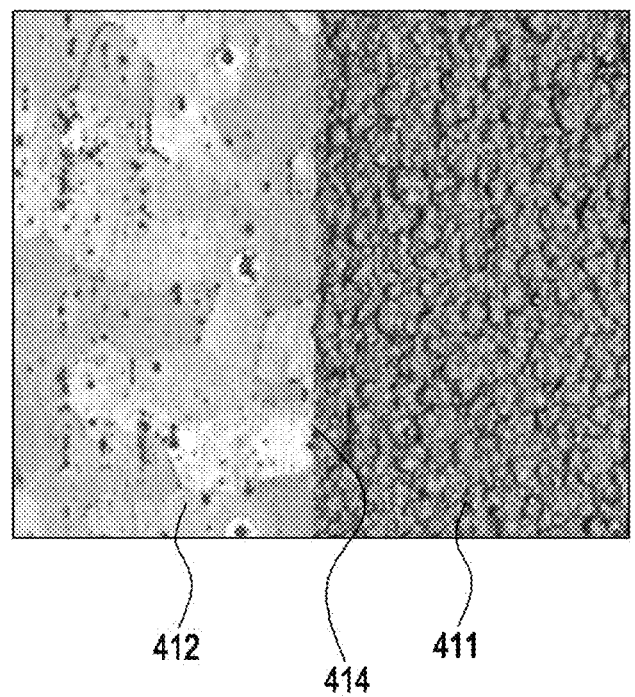
FIG. 11B is a view of the portion illustrated in FIG. 11A viewed from above.

Referring FIG. 9 and FIG. 10 together, in relation to operation 601, as shown in FIG. 10A, the primary processing process (e.g.: matte surface processing process 601) may be a primary processing process performed on a base metal material of the first portion 410 to implement texture of the matte surface. The base metal material may correspond to at least one of an aluminum alloy, a magnesium alloy, a zinc alloy, a copper alloy, a titanium alloy, stainless steel, or an amorphous metal, or a combination thereof. The first surface 411 may be formed by the primary processing process. The primary processing process according to various embodiments of the disclosure may include a process for forming bumps on a surface, such as sand blasting, chemical etching, plasma etching, in order to form matte appearance, and the like.

Thereafter, in relation to operation 602, the surface uniformization process 602 may be performed. Referring to FIG. 10A, as an example of the surface uniformization process, a chemical polishing (CP) process for uniformizing large and uneven bumps on a surface may be performed.

In relation to operation 603, a primary anodizing process (e.g.: matte surface anodizing process 603) may be performed. Referring to FIG. 10B, the primary anodizing process may be a process for forming the oxide film layer 510 for protecting the first surface 411 having been formed by the primary process. The primary anodizing process may be performed to prevent surface damage such as the first surface 411 being dented or scratched by by-product (e.g.: processing chip) generated in a secondary process, which will be described below, or corrosion of the base metal material by cutting oil during processing.

Thereafter, in relation to operation 604, the secondary processing process (e.g.: glossy surface processing process 604) may be performed. Referring to FIG. 10C, the secondary processing process may be a process for forming a second surface 412 on the first portion 410 to implement a glossy texture, or additionally or alternatively for forming a third surface 413, after the primary anodizing process 603. The secondary processing process (e.g.: glossy surface processing process 604) may be a process for expressing smooth and elegant gloss and may implement the glossy surface through CNC processing, diamond cutting, hairline processing, polishing processing, and the like. The first oxide film layer 510 formed on the matte surface through the primary anodizing process (e.g.: matte surface anodizing process 603) may prevent surface damage that may occur on the matte surface such as denting or scratching the matte surface by processing chips, etc. generated during the glossy surface processing process described above and corrosion of the matter surface by a cutting oil.

In relation to operation 605, the anodizing film-stripping process 605 may be performed. Referring FIG. 10D, the anodizing film-stripping process 605 may be a process for stripping the first oxide film layer 510 formed by the primary anodizing process before the secondary anodizing process (e.g.: appearance anodizing process 606). Unlike the embodiment described through FIG. 7 to FIG. 8E, according to various embodiments of the disclosure, the first oxide film layer 510 is removed by film-stripping after the cutting process for the glossy surface by the secondary processing process (e.g.: glossy surface processing process 604). The anodizing film-stripping process 605 according to an embodiment may include a process for exposing the first oxide film layer 510 in a sodium hydroxide (NaOH) solution, separating the first oxide film layer 510 from the interface, and removing the surface damaged by a polishing process for a polymer resin portion in contact with the glossy surface. At this time, care should be taken not to deteriorate the gloss of the glossy surface, and thus the anodizing film-stripping process 605 should only be performed for a relatively short amount of time.

In relation to operation 606, the secondary anodizing process (e.g.: appearance anodizing process 606) may be performed. Referring to FIG. 10E, the second anodizing process may be a process for forming a second oxide film layer 520 on the first surface 411 which is the matte surface, and the second surface 412 and/or the third surface 413 which are glossy surfaces. By performing the secondary anodizing process, the oxide film layer may be formed to a have a uniform thickness (e.g.: 5 μm) on both the matte surface and the glossy surface which are exposed outside after film-stripping processing. By forming an oxide film layer on the entire surface at the same time, a film having a uniform thickness (e.g.: 5 μm) as the anodizing film formed on the matter surface and the glossy surface may be formed on a boundary between the matte surface and the glossy surface (e.g.: first connection member and/or second connection member).

Referring to FIG. 9 and FIG. 10, the second anodizing process (e.g.: appearance anodizing process 606) according to various embodiments of the disclosure may include a step in which the first oxide film layer 510 is removed, and thus may be carried out for a sufficient amount of time so as to allow the second oxide film layer 520 to have a pre-configured thickness. As a result, as shown in FIG. 11A, the second oxide film layer 520 having a uniform thickness may be formed on the first surface 411, the second surface 412, and/or the third surface 413. In addition, an oxide film layer having the uniform thickness may grow on the first connection portion 414 between the first surface 411 and the second surface 412 and the second connection portion 415 between the first surface 411 and the third surface 413. Referring to FIG. 11B, an oxide film layer may be formed on the first connection portion 414 between the first surface 411 and the second surface 412. Therefore, according to various embodiments of the disclosure, a continuous and uniform oxide film layer may be formed on the housing including the first surface 411, the first connection portion 414, and the second surface 412. FIG. 8C shows that the oxide film layer formed on the first surface 411 and the second surface 412 is not continuous and the base metal material may be exposed because the oxide film layer is not formed on the first connection portion 414. Accordingly, the first connection portion 414 in FIG. 8C may be damaged by various causes such as foreign material penetration, corrosion, impacts from external forces, etc. On the other hand, the first connection portion 414 shown in FIG. 11B has the oxide film layer formed thereon and thus may be prevented from being damaged by foreign material or external impact. In addition, it may be verified that the first connection portion 414 shown in FIG. 11B may form a cleaner and smoother boundary compared to the first connection portion 414 shown in FIG. 8C.

Figure 12A:
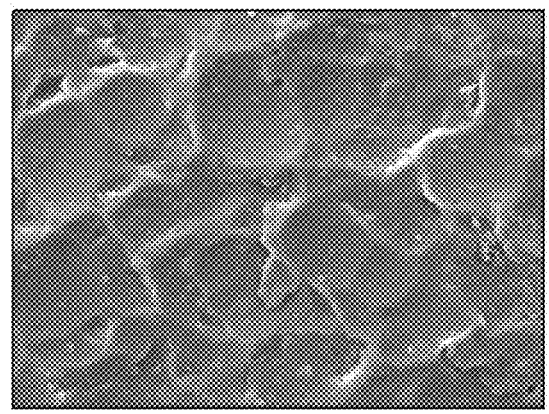
FIG. 12A is a view illustrating surface roughness of a first surface according to a first embodiment.
Figure 12B:
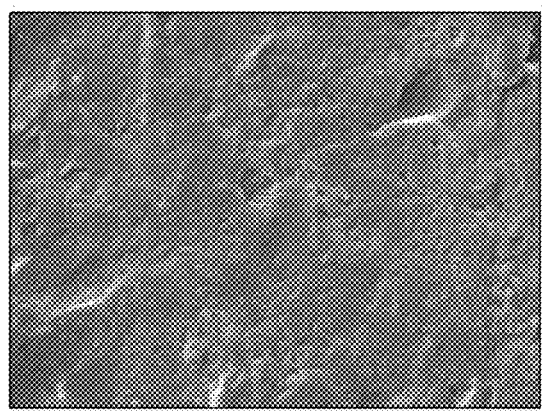
FIG. 12B is a view illustrating surface roughness of a first surface according to a second embodiment.
Figure 12C:
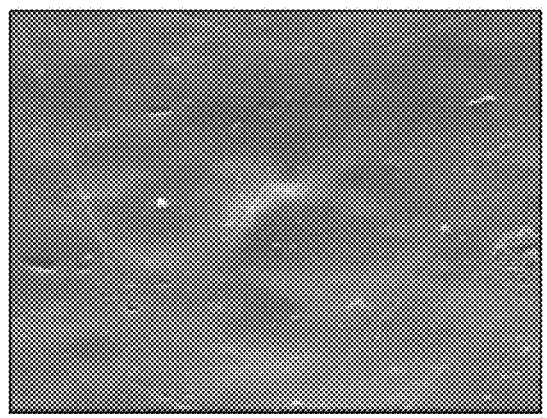
FIG. 12C is a view illustrating surface roughness of a first surface according to a third embodiment.

FIG. 12A is a view illustrating surface roughness of a matte surface (e.g.: first surface) according to a first embodiment. FIG. 12B is a view illustrating surface roughness of a matte surface (e.g.: first surface) according to a second embodiment. FIG. 12C is a view illustrating surface roughness of a matte surface (e.g.: first surface) according to a third embodiment. In relation to various embodiments of the disclosure, surface photographs showing surface roughness of a matte surfaces are shown in FIG. 12A to FIG. 12C.

FIG. 12A may show the first surface of the housing, which has been processed with a matte finish through a sand blasting (or sanding) process. FIG. 12B may show the first surface of the housing, which has been processed with a matte finish through a sand blasting process, followed by a surface uniformization process (e.g.: CP process). FIG. 12C may show the first surface of the housing, which has been processed with a matte finish through a sand blasting process, followed by a surface uniformization process (e.g.: CP process) and an anodizing film-stripping process.

Table 1 below shows surface roughness and surface hardness of the matte surface (e.g.: first surface) according to the first embodiment to the third embodiment.

TABLE 1

| | | Matte surface | | |
|---|---|---|---|---|
| | | First embodiment (Sanding) | Second embodiment (Sanding + CP) | Third embodiment (Sanding + CP + film stripping) |
| Surface Roughness | Ra | 1.00 um or more | 0.5-0.8 um | 0.2-0.7 um |
| | Rz | More than 10.0 um | 3.0-8.0 um | 1.5-6.0 um |
| Surface roughness of oxide film layer | | 270-320 HV | 220-270 HV | 270-320 HV |

In all of the above first to third embodiments shown in FIG. 12A to FIG. 12C, and Table 1, the matte surface formed by a processing process including sand blasting (or sanding).

Referring to FIG. 12A together with Table 1 above, in the case of the matte surface that have not undergone the surface uniformization process (e.g.: CP process) according to the first embodiment, it may be difficult to implement an even texture due to uneven bumps. Referring to FIG. 12B together with Table 1 above, in the case of the matte surface that have undergone the surface uniformization process (e.g.: CP process) according to the second embodiment, it may be possible to obtain a uniform surface compared to FIG. 12A due to bumps being uniformized. However, the matte surface according to the second embodiment may have a vulnerable surface due to chemical etching used in to the uniformization process (e.g.: CP process), and thus may not maintain good surface quality due to frequent damage caused by scratches and corrosion caused by cutting oil during a subsequent processing process for the glossy surface. Referring to FIG. 12C together with Table 1 above, according to the third embodiment, the matte surface that have undergone the surface uniformization process (e.g.: CP process) and the film-stripping process may have favorable roughness and hardness and a uniform surface because a portion damaged by the chemical etching of the surface uniformization process is removed as the anodizing film-stripping process proceeds.

According to an embodiment of the disclosure, the matte surface according to the third embodiment may be employed in manufacturing a housing including the matte surface and the glossy surface to have double texture.

Figure 13:
FIG. 13 is a view illustrating surface roughness of a second surface according to a fourth embodiment.

FIG. 13 shows surface roughness of a glossy surface (e.g.: second surface) according to the fourth embodiment.

Table 2 below shows surface roughness and gloss of the glossy surface (e.g.: second surface) according to the fourth embodiment and the fifth embodiment.

TABLE 2

| | | Glossy surface | |
|---|---|---|---|
| | | Fourth embodiment (Glossy + CP) | Fifth embodiment (Glossy) |
| Roughness | Ra | 0.02-0.08 um | 0.1-0.2 um |
| | Rz | 0.1-1.0 um | 1.0-3.0 um |
| Gloss (GU 60°) | | 450-500 GU | 500 GU or more |

In all the fourth embodiment and the fifth embodiment shown in FIG. 13 and Table 2, the glossy surface formed by a polishing process for expressing smooth and elegant gloss may be a subject.

Referring to Table 2 and FIG. 13 together, when the glossy surface is exposed to the surface uniformization process (e.g.: CP process), the glossy surface may undergo corrosion. For example, as shown in FIG. 13, galvanic corrosion may be accelerated between an intermetallic compound around the glossy surface and a base metal material (e.g.: aluminum base material). As a result, roughness of the glossy surface is increased and the gloss of the glossy surface is lowered, so that the characteristic elegant appearance may be lost. Accordingly, it may be advantageous not to apply the surface uniformization process to the glossy surface. In an embodiment of the disclosure, the polishing of the glossy surface is performed after the surface uniformization process (e.g.: CP process) for the matte surface, and thus the glossy surface may be prevented from being damaged during the surface uniformization process, so that a high-gloss surface may be maintained. According to an embodiment of the disclosure, the glossy surface according to the fifth embodiment may be employed in manufacturing a housing including the matte surface and the glossy surface to have double texture.

Figure 14A:
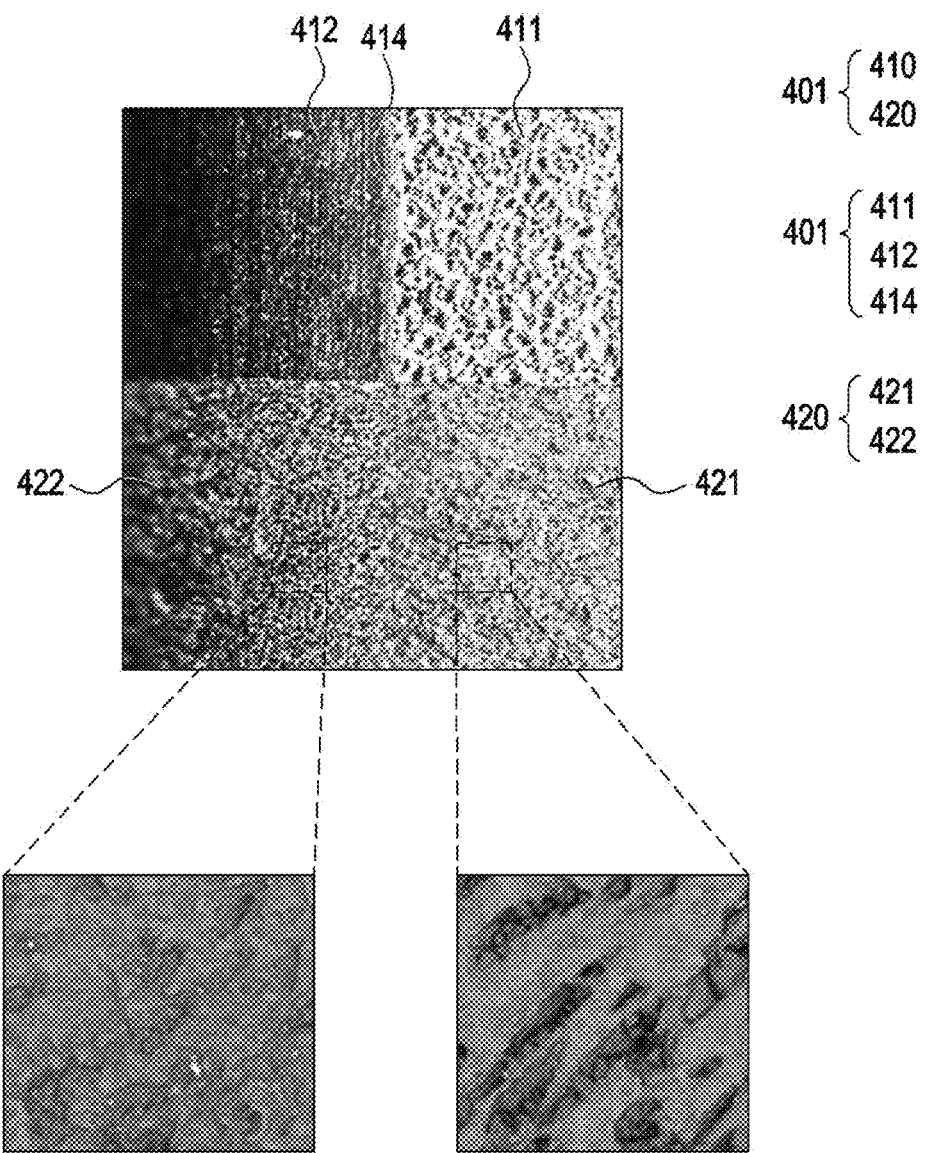
FIG. 14A is a photograph of a surface of a first portion and a second portion of a housing according to a certain embodiment.
Figure 14B:
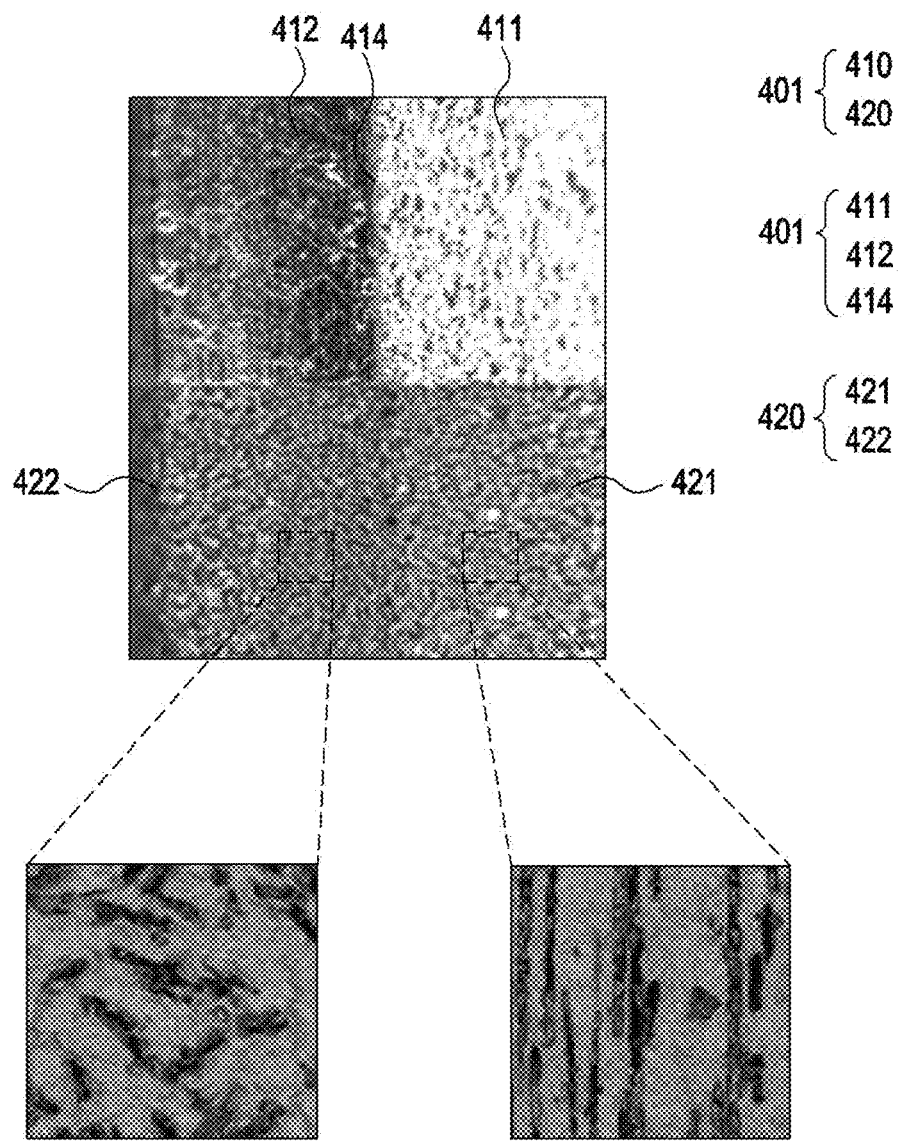
FIG. 14B is a photograph of a surface of a first portion and a second portion of a housing according to various embodiments of the disclosure.

FIG. 14A may show a photograph of a surface of a first portion 410 and a second portion 420 of a housing 401 according to a certain embodiments. FIG. 14B may show a photograph of a surface of a first portion 410 and a second portion 420 of a housing 401 according to various embodiments of the disclosure.

FIG. 14A may show the first portion 410 including the matte surface (e.g.: first surface 411), the glossy surface (e.g.: second surface 412), and the connection portion 414 shown in FIG. 7 to FIG. 8E, and FIG. 14B may show the first portion 410 including the matte surface (e.g.: first surface 411), the glossy surface (e.g.: second surface 412), and the connection portion 414 shown in FIG. 9 to FIG. 11B.

In relation to the first portion 410, the first surface 411 shown in FIG. 14A may form a matte surface having a first texture according to the primary processing process (e.g.: sand blast) and the second surface 412 shown in FIG. 14B may form a glossy surface having a second texture according to the secondary processing process (e.g.: polishing). The first surface 411 shown in FIG. 14B may form a matte surface having a third texture according to the primary processing process (e.g.: sand blast) and the film-stripping process, and the second surface 412 shown in FIG. 14A may form a glossy surface having a fourth texture according to the secondary processing process (e.g.: polishing) and the film-stripping process. By performing the film-stripping process after the secondary processing process (e.g.: polishing), thus removing a damaged portion according to the secondary processing process, the matte surface having the third texture and the glossy surface having the fourth texture shown in FIG. 14B may have textures different from those of the matte surface having the first texture and the glossy surface having the second texture shown in FIG. 14A.

According to various embodiments, the second portion 420 may be affected by a manufacturing process for the first portion 410 disposed adjacent thereto. For example, in the second portion 420 shown in FIG. 14A, the texture of the fifth surface 422 in contact with the glossy surface (e.g.: second surface 412) may become different from the texture of the fourth surface 421 in contact with the matte surface (e.g.: first surface 411) due to the influence of the processing process (e.g.: polishing) of the glossy surface. That is, the second portion 420 shown in FIG. 14A may have uneven gloss. On the contrary, in the case of the second portion 420 shown in FIG. 14B, the fifth surface 422 in contact with the glossy surface (e.g.: second surface 412) may have the same texture as that of the fourth surface 421 in contact with the matte surface (e.g.: first surface 411) as the surface having different texture is removed as the processing process (e.g.: polishing) for the glossy surface is performed by the anodizing film-stripping process (e.g.: 605 in FIG. 9) applied to various embodiments of the disclosure. That is, the second portion 420 shown in FIG. 14B may have uniform gloss.

Summarizing the embodiments described above, the electronic device according to various embodiments of the disclosure may be aesthetically pleasing sensation by configuring the appearance thereof with a housing made of a metal material such as aluminum, magnesium, or titanium. In addition, the double texture may be obtained by configuring a portion of the housing with a glossy surface and another portion with a matte surface, and it is possible to prevent releasing of the oxide film layer or surface corrosion due to external stress by forming a uniform oxide film layer on the surface of the housing formed of a metal material, as well. Furthermore, according to various embodiments disclosed in the disclosure, it is possible to make the appearance of the electronic device elegant by implementing the double texture on the housing of a metal material while uniformizing the texture of the housing of a polymer material disposed adjacent to the housing of a metal material.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments of the disclosure, there may be provided an electronic device including a housing comprising a first surface including a first surface roughness, a second surface including a second surface roughness different from the first surface roughness, and a first connection portion between the first surface and the second surface, and an oxide film layer disposed on the first surface, the second surface, and the first connection portion and configured to have a substantially uniform thickness.

According to various embodiments, the first surface may be a matte surface and the second surface may be a glossy surface.

According to various embodiments, the first surface may be manufactured by a method including a primary processing process configured to generate bumps on a base metal material to arrive at the first surface roughness, an uniformization process configured to uniformizing the first surface, and a primary anodizing process configured to forming an intermediate oxide film layer.

According to various embodiments, the second surface may be manufactured by a method including a secondary processing process for processing the first surface or the base metal material to arrive at the second surface roughness lower than the first surface roughness, and a secondary anodizing process configured to forming the oxide film layer.

According to various embodiments, the secondary processing process may be performed after the primary anodizing process of the first surface.

According to various embodiments, the secondary anodizing process may be performed after a film-stripping process configured to remove the intermediate oxide film layer formed by the primary anodizing process.

According to various embodiments, the first surface may face a first direction, and the second surface may face a second direction different from the first direction.

According to various embodiments, the first connection portion may includes a curved surface.

According to various embodiments, the housing may include a first portion including the first surface, the second surface, the first connection portion, and the first portion may be made of an electrically conductive material.

According to various embodiments, the first portion may be electrically connected to a communication module of the electronic device and configured as an antenna.

According to various embodiments, at least one surface (e.g.: third surface) having a surface roughness different from the first surface roughness may be further included.

According to various embodiments, the at least one surface may face, with reference to a second connection portion, a third direction different from the first direction that the first surface face and a second direction that the second surface faces.

According to various embodiments, a fourth surface disposed adjacent to the first surface and parallel with the first surface, a fifth surface disposed adjacent to the second surface and parallel with the second surface, and a second portion formed of an insulating material may be included.

According to various embodiments, the fourth surface and the fifth surface may have a substantially identical surface roughness.

According to various embodiments, a third surface having a surface roughness different from the second surface and formed to be separated from the second surface with reference to a second connection portion, and a sixth surface of the second portion disposed adjacent to the third surface and parallel with the third surface may be included.

According to various embodiments, the housing may include a front plate; a rear plate facing a direction opposite to the front plate; a side member configured to surround a space between the front plate and the rear plate, wherein the first surface may correspond to the side member and the second surface may correspond to the front plate or the rear plate.

According to various embodiments, there may be provided an electronic device including a housing including a first portion that includes an electrically conductive material and a second portion disposed adjacent to the first portion and including an insulating material; and an oxide film layer formed on the first portion, wherein the first portion includes a first surface having a first surface roughness and a second surface having a second surface roughness substantially different from the first surface, and wherein the second portion includes a fourth surface and a fifth surface having a substantially identical surface roughness to the fourth surface.

According to various embodiments, the oxide film layer may have a substantially identical thickness on the first surface, the second surface, and a first connection portion between the first surface and the second surface.

According to various embodiments, the first portion may be electrically connected to a communication module of the electronic device to be used as an antenna.

According to various embodiments, there may be provided a method for manufacturing a housing of an electronic device, the method including a primary processing process for creating a first surface of the housing including a first surface roughness; a primary anodizing process for forming an intermediate oxide film layer on the first surface; a secondary processing process for creating a second surface of the housing including a second surface roughness; an anodizing film-stripping process for removing the intermediate oxide film layer formed on the first surface; and a secondary anodizing process for forming an oxide film layer on the first surface and the second surface.

According to various embodiments, the first surface may be formed to be a matte surface and the second surface may be formed to be a glossy surface, and a uniformization process for surface uniformizing of the first surface may be further included before the primary anodizing process.

As mentioned above, in the detailed description of the disclosure, specific embodiments have been described, but it will be apparent to those of ordinary skill in the art that various modifications are possible without departing from the scope of the disclosure.

The invention claimed is:

1. An electronic device comprising:
   a housing comprising a first surface including a first surface roughness;
   a second surface extended from the first surface and including a second surface roughness different from the first surface roughness;
   an oxide film layer having a first film portion disposed on the first surface and a second film portion extended from the first film portion is disposed on the second surface;
   the first film portion and the second film portion having a substantially uniform thickness, and a substantially uniform roughness; and
   an end section of the first film portion and an end section of the second film portion facing the first film portion formed at the same position.

2. The electronic device of claim 1, wherein the first surface is a matte surface, and the second surface is a glossy surface.

3. The electronic device of claim 2, wherein the first surface is manufactured by a primary processing process configured to generate bumps on a base metal material to arrive at the first surface roughness, an uniformization process configured to uniformize the first surface, and a primary anodizing process configured to form an intermediate oxide film layer.

4. The electronic device of claim 3, wherein the second surface is manufactured by a secondary processing process configured to process the first surface or the base metal material to arrive at the second surface roughness lower than the first surface roughness, and a secondary anodizing process configured to form the oxide film layer.

5. The electronic device of claim 4, wherein the secondary processing process is performed after the primary anodizing process of the first surface.

6. The electronic device of claim 5, wherein the secondary anodizing process is performed after a film-stripping process configured to remove the intermediate oxide film layer formed by the primary anodizing process.

7. The electronic device of claim 1, wherein the housing comp rises a first connection portion
   wherein the first connection portion connects the first surface and the second surface, and
   the first connection portion includes curved surface.

8. The electronic device of claim 1, wherein the housing comprises a first portion including the first surface, the second surface, wherein the first portion is made of an electrically conductive material.

9. The electronic device of claim 8, wherein the first portion is electrically connected to a communication module of the electronic device and configured as an antenna.

10. The electronic device of claim 1, further comprising at least one surface having a surface roughness different from the first surface roughness.

11. The electronic device of claim 10, wherein the at least one surface faces, with reference to a second connection portion, a third direction different from a first direction that the first surface faces and a second direction that the second surface faces.

12. The electronic device of claim 1, further comprising:
    a third surface having a surface roughness different from the second surface roughness and formed to be separated from the second surface with reference to a second connection portion.

13. The electronic device of claim 12, further comprising:
    a second portion including a fourth surface disposed adjacent to the first surface and parallel with the first surface and a fifth surface disposed adjacent to the second surface and parallel with the second surface, and a sixth surface disposed adjacent to the third surface and parallel with the third surface, wherein the second portion is made of an insulating material.

14. The electronic device of claim 13, further comprising:
    wherein the fourth surface and the fifth surface and the sixth surface are configured to include a substantially identical surface roughness.

15. The electronic device of claim 1, wherein the housing further comprises:
    a front plate;
    a rear plate facing a direction opposite to the front plate; and
    a side member configured to surround a space between the front plate and the rear plate, and
    wherein the first surface corresponds to the side member, and the second surface corresponds to the front plate or the rear plate.

16. An electronic device comprising:
    a housing including a first portion that includes an electrically conductive material and a second portion disposed adjacent to the first portion and including an insulating material; and
    an oxide film layer formed on the first portion,
    wherein the first portion includes a first surface having a first surface roughness and a second surface having a second surface roughness substantially different from the first surface roughness, and
    wherein the second portion includes a fourth surface and a fifth surface having a substantially identical surface roughness to the fourth surface,
    wherein the oxide film layer has a first film portion is disposed on the first surface and a second film portion extended from the first film portion is disposed on the second surface,
    the first film portion and the second film portion having a substantially uniform roughness; and
    an end section of the first film portion and an end section of the second film portion facing the first film portion formed at the same position.

17. The electronic device of claim 16, wherein the oxide film layer is configured to include a substantially identical thickness on the first surface, the second surface, and a first connection portion between the first surface and the second surface.

18. The electronic device of claim 16, wherein the first portion is electrically connected to a communication module of the electronic device and configured as an antenna.

* * * * *